(12) United States Patent
Kondo et al.

(10) Patent No.: US 9,865,699 B2
(45) Date of Patent: Jan. 9, 2018

(54) SEMICONDUCTOR DEVICE AND METHOD OF MANUFACTURING THE SAME

(71) Applicant: FUJITSU LIMITED, Kawasaki-shi, Kanagawa (JP)

(72) Inventors: Daiyu Kondo, Kawasaki (JP); Shintaro Sato, Kawasaki (JP)

(73) Assignee: FUJITSU LIMITED, Kawasaki-shi (JP)

( * ) Notice: Subject to any disclaimer, the term of this patent is extended or adjusted under 35 U.S.C. 154(b) by 0 days.

(21) Appl. No.: 15/166,863

(22) Filed: May 27, 2016

(65) Prior Publication Data

US 2016/0284813 A1    Sep. 29, 2016

Related U.S. Application Data

(60) Division of application No. 14/563,405, filed on Dec. 8, 2014, now Pat. No. 9,385,209, which is a division
(Continued)

(51) Int. Cl.
*H01L 29/66* (2006.01)
*H01L 21/02* (2006.01)
(Continued)

(52) U.S. Cl.
CPC .... *H01L 29/66045* (2013.01); *H01L 21/0228* (2013.01); *H01L 21/0262* (2013.01);
(Continued)

(58) Field of Classification Search
CPC ...................... H01L 29/1606; H01L 29/66015
See application file for complete search history.

(56) References Cited

U.S. PATENT DOCUMENTS 5,863,601 A    1/1999    Kikuchi et al.
8,614,435 B2   12/2013   Avouris et al.
(Continued)

FOREIGN PATENT DOCUMENTS

EP    0 732 421 A1    9/1996
JP    7-2508          1/1995
(Continued)

OTHER PUBLICATIONS

M. Kusunoki, et al.; "A formation mechanism of carbon nanotube films on SiC(001);" Applied Physics Letters; vol. 77; No. 4; Jul. 24, 2000; pp. 531-533/p. 2 of specification.
(Continued)

*Primary Examiner* — Yu-Hsi D Sun
(74) *Attorney, Agent, or Firm* — Kratz, Quintos & Hanson, LLP

(57) ABSTRACT

A semiconductor device including a graphene layer and a method of manufacturing the same are disclosed. A method in which graphene is grown on a catalyst metal by a chemical vapor deposition or the like is known. However, the graphene cannot be used as a channel, since the graphene is in contact with the catalyst metal, which is conductive. There is disclosed a method in which a catalyst film (2) is formed over a substrate (1), a graphene layer (3) is grown originating from the catalyst film (2), an electrode (4) in contact with the graphene layer (3) is formed, and the catalyst film (2) is removed.

4 Claims, 17 Drawing Sheets

Related U.S. Application Data of application No. 13/453,125, filed on Apr. 23, 2012, now Pat. No. 8,932,904, which is a continuation of application No. PCT/JP2009/069383, filed on Nov. 13, 2009.

(51) Int. Cl.

| | | |
|---|---|---|
| *H01L 29/16* | (2006.01) | |
| *H01L 23/532* | (2006.01) | |
| *H01L 29/778* | (2006.01) | |
| *H01L 21/04* | (2006.01) | |
| *H01L 29/786* | (2006.01) | |

(52) U.S. Cl.
CPC .. *H01L 21/02164* (2013.01); *H01L 21/02178* (2013.01); *H01L 21/02181* (2013.01); *H01L 21/02282* (2013.01); *H01L 21/02381* (2013.01); *H01L 21/02488* (2013.01); *H01L 21/02491* (2013.01); *H01L 21/02502* (2013.01); *H01L 21/02527* (2013.01); *H01L 21/02645* (2013.01); *H01L 21/043* (2013.01); *H01L 23/53276* (2013.01); *H01L 29/1606* (2013.01); *H01L 29/66015* (2013.01); *H01L 29/66742* (2013.01); *H01L 29/778* (2013.01); *H01L 29/78648* (2013.01); *H01L 29/78696* (2013.01); *H01L 29/78645* (2013.01); *H01L 29/78684* (2013.01); *H01L 2924/0002* (2013.01); *Y10S 977/734* (2013.01)

(56) References Cited

U.S. PATENT DOCUMENTS

| | | | |
|---|---|---|---|
| 2009/0096024 A1 | 4/2009 | Shingu et al. | |
| 2009/0164432 A1 | 6/2009 | Wang et al. | |
| 2009/0221130 A1* | 9/2009 | Asano | B82Y 10/00 438/478 |
| 2010/0320467 A1 | 12/2010 | Ukeda et al. | |
| 2011/0030772 A1 | 2/2011 | Veerasamy | |
| 2011/0101309 A1 | 5/2011 | Lin et al. | |
| 2011/0175091 A1 | 7/2011 | Kobayashi et al. | |
| 2012/0161098 A1 | 6/2012 | Hiura et al. | |
| 2012/0256167 A1 | 10/2012 | Heo et al. | |

FOREIGN PATENT DOCUMENTS

| | | |
|---|---|---|
| JP | 8-260150 | 10/1996 |
| JP | 9-31757 | 2/1997 |
| JP | 2009-143761 | 7/2009 |
| JP | 2009-164432 A1 | 7/2009 |
| JP | 2009-234815 A | 10/2009 |
| JP | 2009-252798 | 10/2009 |
| WO | 2008/023669 A1 | 2/2008 |
| WO | 2011/021715 A1 | 2/2011 |

OTHER PUBLICATIONS

International Search Report for International Application No. PCT/JP2009/069383 dated Feb. 2, 2010.
Japanese Office Action dated Jul. 16, 2013, in counterpart Japanese Application No. 2011-540372.
Extended European Search Report dated Aug. 1, 2013 in courterpart application No. 09851281.7.
Japanese Office Action issued for Japanese Patent Application 2011-540372 dated May 13, 2014 with summary of the Office Action in English.
International Preliminary Examination Report issued in courterpart application No. PCT/JP2009/069383 dated Jun. 21, 2012 (7 pages).
Summons to attend oral proceedings with annex, dated Aug. 9, 2017, by the European Patent Office in copending European Patent Application No. 09851281 (five pages).
Chinese Patent Application No. 2015102492931.1: First Office Action dated Apr. 5, 2017.
U.S. Appl. No. 13/453,125: Office Action dated Oct. 3, 2013.
U.S. Appl. No. 13/453,125: Office Action dated May 15, 2014.
U.S. Appl. No. 14/563,405: Office Action dated Nov. 20, 2015.

* cited by examiner

SEMICONDUCTOR DEVICE AND METHOD OF MANUFACTURING THE SAME

This application is a divisional application of U.S. application Ser. No. 14/563,405, filed Dec. 8, 2014, which is a divisional application of U.S. application Ser. No. 13/453,125, filed Apr. 23, 2012, which is a continuation of International Application PCT/JP2009/069383 filed on Nov. 13, 2009 and designated the U.S., the entire contents of which are incorporated herein by reference in their entireties.

TECHNICAL FIELD

The present invention relates to a conductor device and a method of manufacturing the same.

BACKGROUND ART

In recent years, graphene is attracting attention as the material of the channel of a field-effect transistor. Further, graphene is attracting attention also as the material of the wiring of a semiconductor device. This is because graphene has an electron mobility higher by several orders than that of silicon, and has a high current density resistance. Hence, various discussions are made for the method of manufacturing a semiconductor device including a channel and/or a wiring partially using graphene.

For example, there is a known method in which graphene is peeled off graphite with an adhesive tape or the like and put on a desired position. However, with this method, it is very difficult to manufacture a fine semiconductor device. Further, huge amount of time is required for the processing.

There is another method in which graphene is produced by sublimating silicon from a silicon carbide (SiC) substrate. However, since the heating at 1200° C. or higher is required for sublimation of silicon, this method cannot be employed for manufacture of a semiconductor device including a silicon oxide film or the like.

There is still another known method in which graphene is grown by a chemical vapor deposition method or the like on a catalyst metal. However, with this method, graphene cannot be used as a channel because the graphene is in contact with a catalyst metal that is a conductor.

CITATION LIST

Patent Literature

Patent Literature 1: Japanese Laid-open Patent Publication No. 7-2508
Patent Literature 2: Japanese Laid-open Patent Publication No. 8-260150
Patent Literature 3: Japanese Laid-open Patent Publication No. 9-31757

Non Patent Literature

Non Patent Literature 1: Appl. Phys. Lett. 77 (2000) 531

SUMMARY OF INVENTION

Technical Problem

An object of the present invention is to provide a semiconductor device which can be easily manufactured using graphene, and a method of manufacturing the same.

Solution to Problem

In an aspect of the method of manufacturing a semiconductor device, a catalyst film is formed over an insulator, a graphene layer is grown originating from the catalyst film, and a conductive film in contact with the graphene layer is formed over the insulator. Note that the graphene is a basic unit of graphite, and graphite has a plurality of graphenes layered one on top of another.

DESCRIPTION OF EMBODIMENTS

Hereinafter, embodiments will be concretely described referring to the accompanying drawings.

First Embodiment

Figure 1:
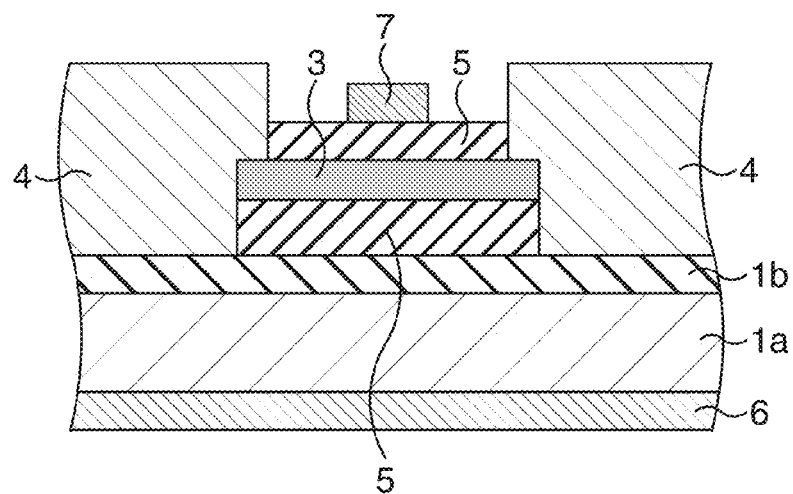
FIG. 1 is a sectional view illustrating a semiconductor device according to a first embodiment.

First, a first embodiment will be described. FIG. 1 is a sectional view illustrating a semiconductor device according to the first embodiment.

In the first embodiment, a silicon oxide film 1b is formed on a silicon layer 1a, and two electrodes 4 are formed on the silicon oxide film 1b as illustrated in FIG. 1. Further, between the two electrodes 4, a graphene layer 3 is suspended. The graphene layer 3 includes one layer, or two or more layers of graphene. Further, an insulation film 5 surrounding the graphene layer 3 is formed. Examples of the material of the insulation film 5 include hafnium oxide, aluminum oxide, silicon oxide, titanium oxide, HfAlO, AlN, BN, $TiO_2$, $Ta_2O_3$, $V_2O_3$, $Nb_2O_3$, and the like. The insulation film 5 is filled in a gap between the graphene layer 3 and the silicon oxide film 1b. Further, the insulation film 5 covers the upper surface of the graphene layer 3. Further, a top gate electrode 7 is formed on a portion of the insulation film 5 located on the upper surface of the graphene layer 3. Further, a back gate electrode 6 is formed on the back surface of the silicon layer 1a.

Figure 2:
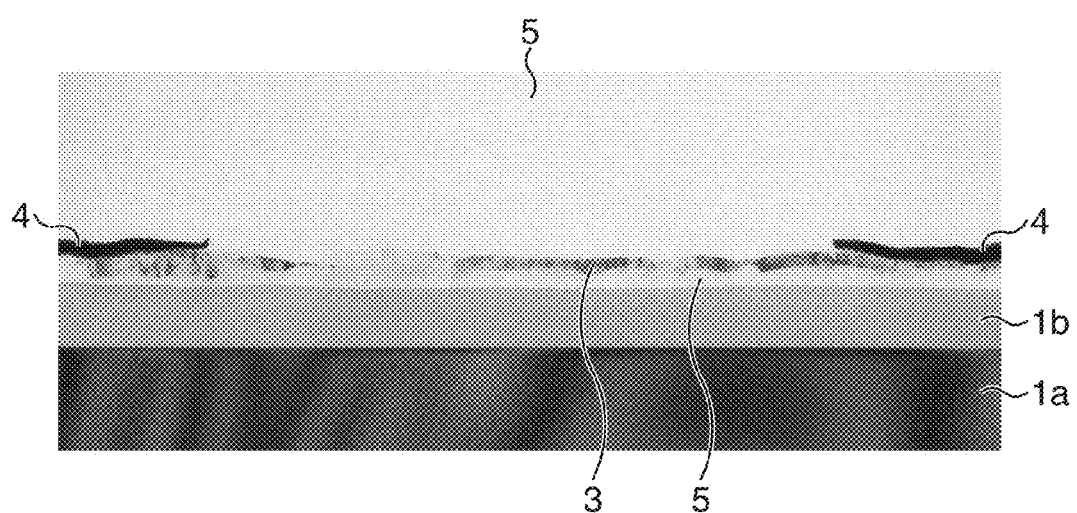
FIG. 2 is a view presenting a transmission electron microscope photograph of a part of the structure illustrated in FIG. 1.

In the first embodiment configured as described above, the Fermi level of the graphene layer 3 varies according to the potential of the back gate electrode 6 and the potential of the top gate electrode 7. Further, the graphene layer 3 is enclosed with the insulation film 5, and the path of current flowing between the two electrodes 4 is only the graphene layer 3. Accordingly, the graphene layer 3 serves as a channel, and the two electrodes 4 serve as a source electrode and a drain electrode. Note that in order to make the field effect by the gate voltage effectively work, the number of layers of graphene included in the graphene layer 3 is preferably about 1 to 10. A transmission electron microscope (TEM) photograph of a part of the structure illustrated in FIG. 1 is presented in FIG. 2, and a part of FIG. 2 is enlarged and presented in FIG. 3.

Note that one of the back gate electrode 6 and the top gate electrode 7 may be omitted.

Next, a method of manufacturing the semiconductor device according to the first embodiment will be described. FIG. 4A to FIG. 4G are sectional views illustrating the method of manufacturing the semiconductor device according to the first embodiment in order of steps.

Figure 4A:
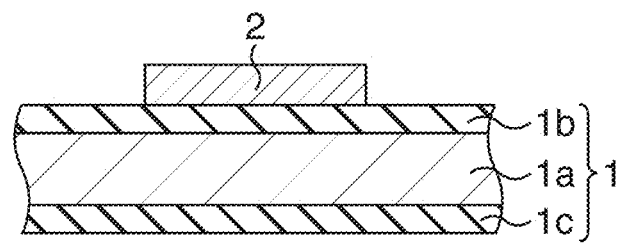
FIG. 4A is a sectional view illustrating a method of manufacturing the semiconductor device according to the first embodiment.

First, as illustrated in FIG. 4A, a catalyst film 2 is formed on a substrate 1. Used as the substrate 1 is, for example, the one in which the silicon oxide film 1b is formed on the front surface of the silicon layer 1a and a silicon oxide film 1c is formed on the back surface of the silicon layer 1a. The silicon oxide films 1b and 1c are formed, for example, by thermal oxidation. As the catalyst film 2, for example, an iron (Fe) film with a thickness of about 200 nm is formed by a lift-off method. More specifically, a resist film having an opening at an area where the catalyst film 2 will be formed is formed on the silicon oxide film 1b, and a catalyst film is deposited by a sputtering method, for example. In the formation of the resist film, a photolithography technique or an electron beam lithography technique may be employed. Then, the resist film is removed together with the catalyst film thereon. As a result, the catalyst film 2 remains on the silicon oxide film 1b. The conditions of forming the catalyst film by the sputtering method are not particularly limited, but, for example, the power is set to 100 W and the sputtering rate is set to 1 Å/sec. Further, in place of the sputtering method, an electron beam evaporation method or a molecular beam epitaxy (MBE) method may be used. As the catalyst film 2, a film of a compound or an alloy containing iron such as iron oxide (FeO or $Fe_2O_3$), iron chloride ($Fe_2Cl_3$) and ferrocobalt (CoFe) may be formed. Further, as the catalyst film 2, a film of nickel (Ni), cobalt (Co), platinum (Pt), gold (Au), or copper (CU) may be formed, or a film of a compound or an alloy containing Ni, Co, Pt, Au, Cu may be formed. The thickness of the catalyst film 2 is not particularly limited, but is preferably 50 nm to 1000 nm, more preferably 100 nm to 500 nm.

Figure 4B:
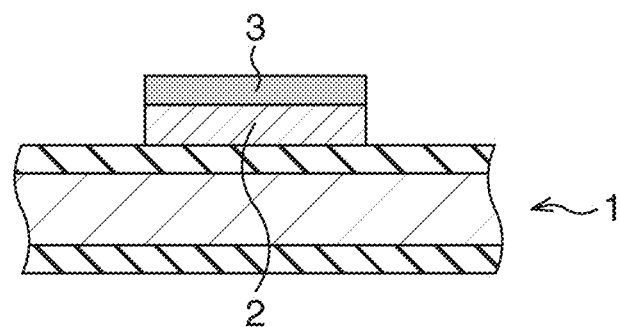
FIG. 4B is a sectional view illustrating, subsequently to FIG. 4A, the method of manufacturing the semiconductor device according to the first embodiment.

Subsequently, as illustrated in FIG. 4B, the graphene layer 3 is formed on the catalyst film 2. The formation of the graphene layer 3 is performed by a thermal CVD (chemical vapor deposition) method in a vacuum chamber. In this case, for example, the temperature of the substrate 1 is set to about 650° C., and the total pressure of a mixed gas of acetylene and argon as a raw material gas is set to about 1 kPa. The ratio of the partial pressure of acetylene to the total pressure may be set to, for example, about 0.001% to 10%, and is preferably adjusted according to the thickness and the growth conditions of the graphene layer 3 to be grown. Further, the formation of the graphene layer 3 may be performed by a hot filament CVD method, a remote plasma CVD method, a plasma CVD method or the like. Further, as the raw material gas, a hydrocarbon gas such as ethylene, methane, or ethane, or alcohol such as ethanol may be used, and a small amount of water or on oxidizing gas such as oxygen may be added to the raw material gas. Further, the temperature of the substrate 1 is set to, for example, 300° C. to 800° C., and is preferably adjusted according to the kind and the thickness of the catalyst film 2 and the kind of the raw material gas and so on. When an iron film is used as the catalyst film 2 and acetylene is used as the raw material gas, the temperature of the substrate 1 is preferably set to about 550° C. to 700° C.

Figure 4C:
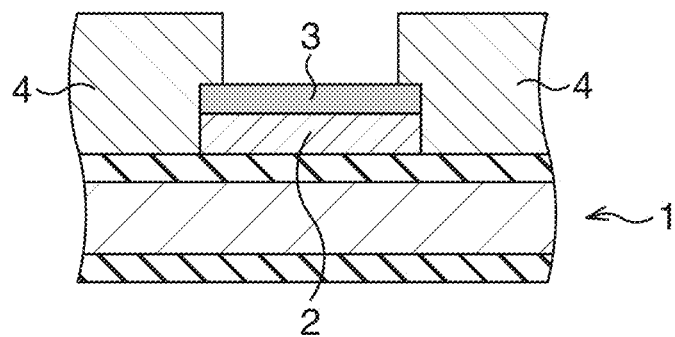
FIG. 4C is a sectional view illustrating, subsequently to FIG. 4B, the method of manufacturing the semiconductor device according to the first embodiment.

Thereafter, as illustrated in FIG. 4C, the two electrodes 4 covering the upper surface and the side surfaces at end portions of the graphene layer 3 are formed on the silicon oxide film 1b. As the electrode 4, a multilayer body of, for example, a titanium (Ti) film with a thickness of about 10 nm and a Au film with a thickness of about 200 nm on the Ti film is formed by the lift-off method. Note that in the formation of the resist film, for example, the photolithography technique or the electron beam lithography technique may be employed.

Figure 4D:
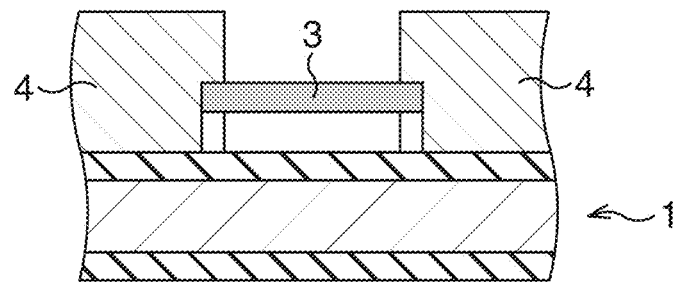
FIG. 4D is a sectional view illustrating, subsequently to FIG. 4C, the method of manufacturing the semiconductor device according to the first embodiment.

Subsequently, as illustrated in FIG. 4D, the catalyst film 2 is removed. Since both end portions of the graphene layer 3 are held by the electrodes 4 from the sides, the graphene layer 3 is suspended between the electrodes 4. The catalyst film 2 may be removed by a wet treatment using, for example, hydrochloric acid, aqueous iron chloride solution, hydrofluoric acid or the like. When a Fe film with a thickness of about 10 nm to 500 nm is formed as the catalyst film 2, the removal of the catalyst film 2 may be completed in about 30 minutes with hydrochloric acid with a concentration of 9 vol %.

Figure 4E:
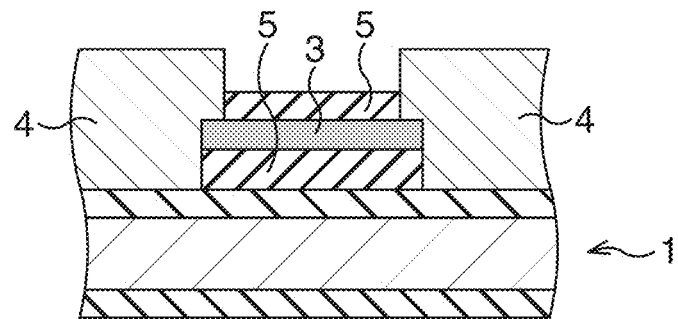
FIG. 4E is a sectional view illustrating, subsequently to FIG. 4D, the method of manufacturing the semiconductor device according to the first embodiment.

Subsequently, as illustrated in FIG. 4E, the insulation film 5 covering exposed surfaces of the grapheme layer 3 is formed. When hafnium oxide or aluminum oxide is used as the material of the insulation film 5, the insulation film 5 may be deposited to cover the graphene layer 3, for example, by an atomic layer deposition method (ALD method). When hafnium oxide is used as the material of the insulation film 5, the insulation film 5 may be formed at a temperature of 250° C. with tetrakis (diethylamino) hafnium (TDMAH) as a raw material. When aluminum oxide is used as the material of the insulation film 5, the insulation film 5 may be formed at a temperature of 300° C. with trimethylaluminum as a raw material. When silicon oxide is used as the material of the insulation film 5, the insulation film 5 may be formed by applying an SOG (spin on glass) solution by a spin coating method, and annealing it at a temperature of about 500° C. in a nitrogen atmosphere.

Figure 4F:
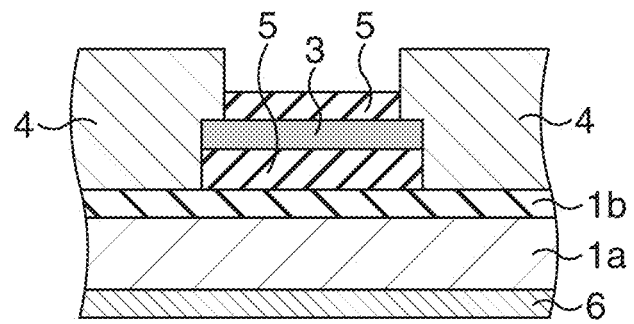
FIG. 4F is a sectional view illustrating, subsequently to FIG. 4E, the method of manufacturing the semiconductor device according to the first embodiment.

Thereafter, as illustrated in FIG. 4F, the silicon oxide film 1c is removed. The silicon oxide film 1c may be removed, for example, using buffered hydrofluoric acid or the like while a portion upper than the silicon layer 1a is protected by a resist film (for example, "TSMR-V50" manufactured by Tokyo Ohka Kogyo Co., Ltd.). The treatment time may be about 5 minutes. Subsequently, the back gate electrode 6 is formed on the back surface of the silicon layer 1a. As the back gate electrode 6, a multilayer body of, for example, a Ti film with a thickness of about 10 nm and a Au film with a thickness of about 100 nm on the Ti film may be formed by the electron beam evaporation method.

Figure 4G:
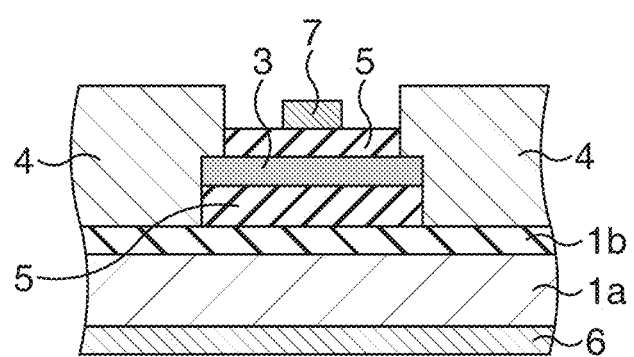
FIG. 4G is a sectional view illustrating, subsequently to FIG. 4F, the method of manufacturing the semiconductor device according to the first embodiment.

Subsequently, as illustrated in FIG. 4G, the top gate electrode 7 is formed on a portion of the insulation film 5 covering the upper surface of the graphene layer 3. As the top gate electrode 7, a multilayer body of, for example, a Ti film with a thickness of about 10 nm and a Au film with a thickness of about 100 nm on the Ti film is formed by the lift-off method. Note that in the formation of the resist film, for example, the photolithography technique or the electron beam lithography technique may be employed. The deposition of the Ti film and the Au film may be performed by the electron beam evaporation method.

In this manner, the semiconductor device according to the first embodiment may be manufactured.

Though the graphene layer 3 is formed on the catalyst film 2 in the manufacturing method, the graphene layer 3 can be made to surly serve as a channel because the catalyst film 2 is appropriately removed.

Figure 3:
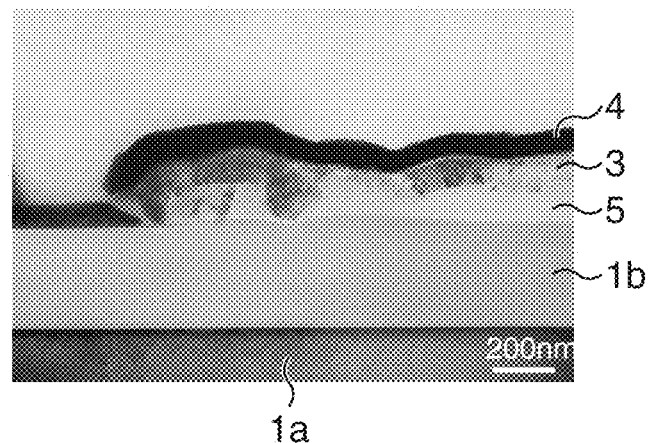
FIG. 3 is a view presenting a part of FIG. 2 enlarged.

Note that the sample whose photograph is presented in FIG. 2 and FIG. 3 was produced following such a manufacturing method. Concretely, a Fe film with a thickness of 200 nm was used as the catalyst film 2, and the total pressure of the mixed gas of acetylene and argon was set to about 1 kPa and the temperature of the substrate 1 was set to 650° C. when forming the graphene layer 3.

When a Co film is used as the catalyst film 2 in place of the Fe film, the Co film is preferably formed on a titanium nitride (TiN) film serving as a base film. In this case, for example, the thickness of the Co film is set to about 1 nm to 100 nm, and the thickness of the TiN film is set to about 0.1 nm to 50 nm. The Co film and the TiN film may be formed by the sputtering method or the like. Further, by performing the formation of the grapheme layer 3 by the thermal CVD method for 30 minutes with the temperature of the substrate 1 set at 510° C., the thickness of the graphene layer 3 becomes about 21 nm. In the case of using the Co film as described above, the graphene layer 3 can be grown at a lower temperature than that in the case of using the Fe film. Therefore, it is possible to suppress damage to a portion susceptible to heat, such as an interlayer insulation film.

Note that a film of metal, nitride, oxide, carbide and alloy containing at least one of titanium (Ti), titanium silicide (TiSi), tantalum (Ta), aluminum (Al), vanadium (V), molybdenum (Mo) and niobium (Nb) may be used.

Further, the base film may be removed together with the catalyst film 2 by acid treatment or the like.

Second Embodiment

Figure 5:
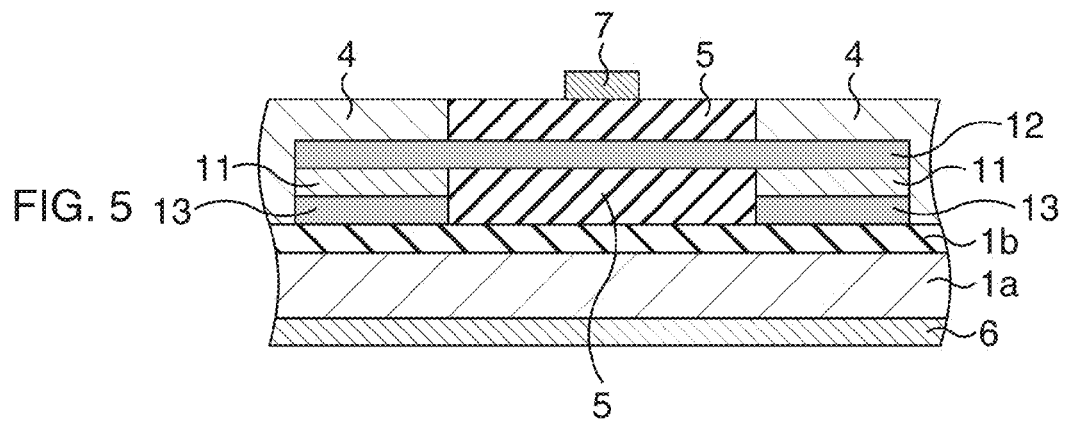
FIG. 5 is a sectional view illustrating a semiconductor device according to a second embodiment.

Next, a second embodiment will be described. FIG. 5 is a sectional view illustrating a semiconductor device according to the second embodiment.

In the second embodiment, as illustrated in FIG. 5, a graphene layer 12 is suspended between the two electrodes 4. Further, a graphene layer 13 and a metal film 11 located thereon are formed under portions of the graphene layer 12 where its upper surface and side surfaces are in contact with the electrodes 4. The lower surface of the graphene layer 13 is in contact with the upper surface of the silicon oxide film 1b and the upper surface of the metal film 11 is in contact with the lower surface of the graphene layer 12. Each of the graphene layers 12 and 13 includes one layer, or two or more layers of graphene. The metal film 11 is a multilayer body having a Co film, a titanium nitride (TiN) film, and a CO film layered in order from the bottom. The insulation film 5 covering the graphene layer 12 is formed between the two electrodes 4. The other structure is the same as that of the first embodiment.

In the second embodiment, the graphene layers 12 and 13 may be formed at a lower temperature than that for the graphene layer 3 in the first embodiment. Accordingly, it is possible to suppress damage to an interlayer insulation film or the like that is susceptible to heat.

Next, a method of manufacturing the semiconductor device according to the second embodiment will be described. FIG. 6A to FIG. 6F are sectional views illustrating the method of manufacturing the semiconductor device according to the second embodiment in order of steps.

Figure 6A:
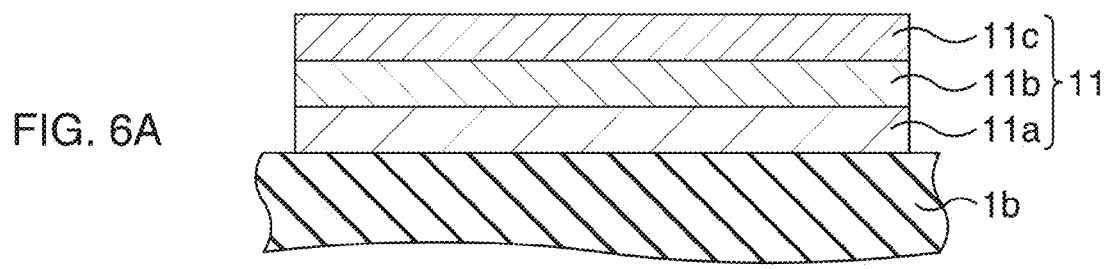
FIG. 6A is a sectional view illustrating a method of manufacturing the semiconductor device according to the second embodiment.

First, as illustrated in FIG. 6A, the metal film 11 in a predetermined planar shape is formed on the silicon oxide film 1b of the substrate 1. More specifically, for example, a Co film 11a with a thickness of 4.3 nm, a TiN film 11b with a thickness of 2.5 nm, and a Co film 11c with a thickness of 4.3 nm are formed in this order by the sputtering method or the like. The thicknesses of the Co films 11a and 11c may be about 1 nm to 10 nm, and the thickness of the TiN film 11b may be about 0.1 nm to 10 nm.

Figure 6B:
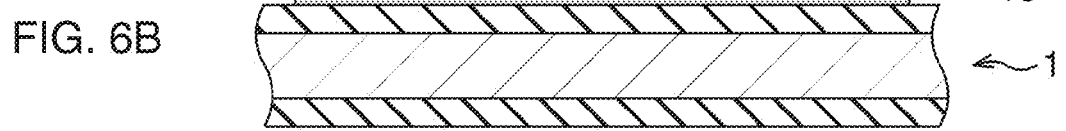
FIG. 6B is a sectional view illustrating, subsequently to FIG. 6A, the method of manufacturing the semiconductor device according to the second embodiment.

Subsequently, as illustrated in FIG. 6B, the graphene layer 12 is formed on the metal film 11 and the graphene layer 13 is formed between the metal film 11 and the silicon oxide film 1b by the thermal CVD method, for example. In this event, the metal film 11 serves as a catalyst film. When the temperature of the substrate 1 is set to 450° C., the graphene layers 12 and 13 with a thickness of about 15 nm may be obtained by the treatment for 15 minutes.

Figure 6C:
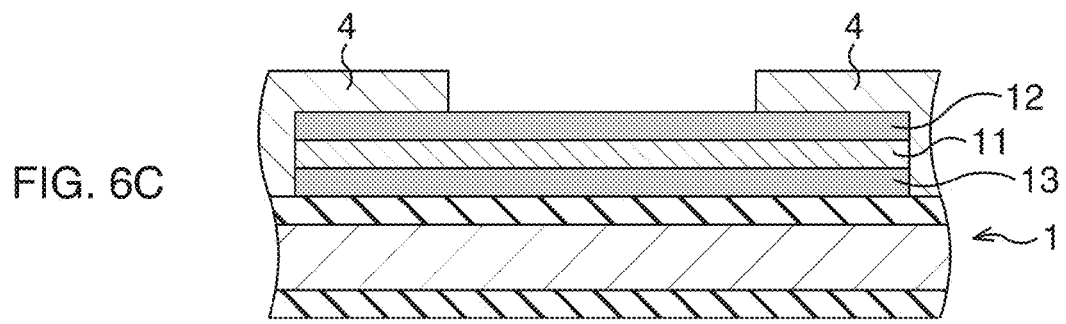
FIG. 6C is a sectional view illustrating, subsequently to FIG. 6B, the method of manufacturing the semiconductor device according to the second embodiment.

Thereafter, as illustrated in FIG. 6C, the two electrodes 4 covering the upper surface of the graphene layer 12 and the side surfaces at end portions of the graphene layer 12, the metal film 11, and the graphene layer 13 are formed on the silicon oxide film 1b.

Figure 6D:
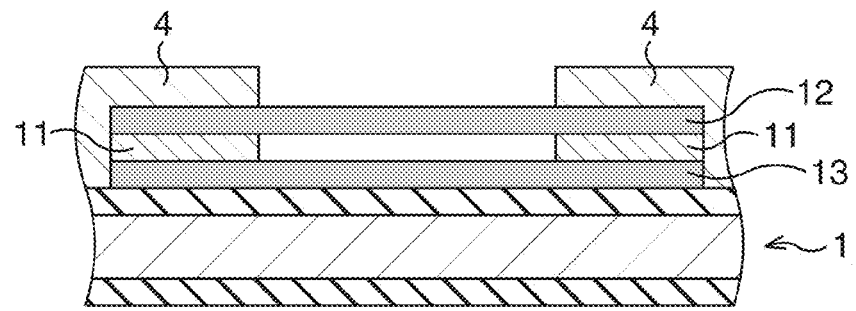
FIG. 6D is a sectional view illustrating, subsequently to FIG. 6C, the method of manufacturing the semiconductor device according to the second embodiment.

Subsequently, as illustrated in FIG. 6D, the metal film 11 is removed. Since both end portions of the graphene layer 12 are held by the electrodes 4 from the sides, the graphene layer 12 is suspended between the electrodes 4. Note that the metal film 11 may be removed by the wet treatment using, for example, hydrochloric acid, aqueous iron chloride solution, hydrofluoric acid or the like as with the catalyst film 2 in the first embodiment.

Figure 6E:
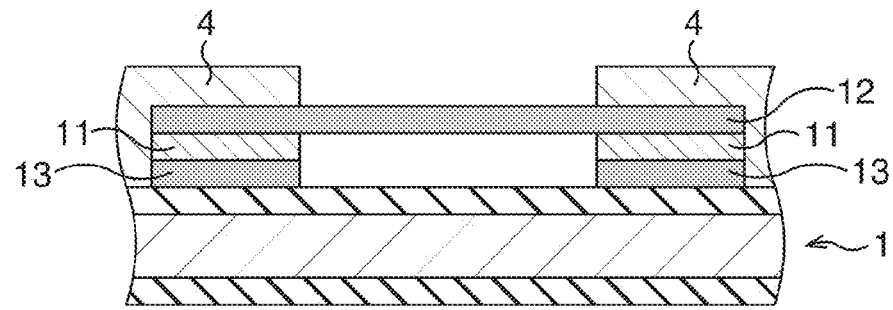
FIG. 6E is a sectional view illustrating, subsequently to FIG. 6D, the method of manufacturing the semiconductor device according to the second embodiment.

Subsequently, as illustrated in FIG. 6E, a portion of the graphene layer 13 located between the electrodes 4 is removed. This removal may be performed, for example, by ultrasonic cleaning. Since the adhesion between the graphene layer 13 and the silicon oxide layer 1b is low, the portion of the graphene layer 13 may be easily removed. If the graphene layer 12 is too thick for a channel, the graphene layer 12 is thinned by ashing with oxygen plasma or heat treatment in an oxygen atmosphere. As the conditions of ashing, for example, the power is set to 200 W, the oxygen flow rate is set to 50 ml/min, and the processing time is set to about 1 minute to 5 minutes. The processing time is preferably adjusted depending on the thickness and the quality of the graphene layer 12.

Figure 6F:
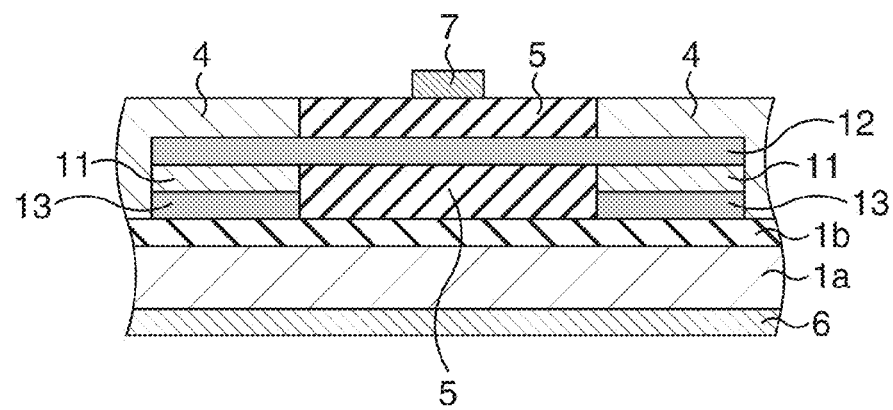
FIG. 6F is a sectional view illustrating, subsequently to FIG. 6E, the method of manufacturing the semiconductor device according to the second embodiment.

Thereafter, as illustrated in FIG. 6F, the formation of the insulation film 5, the formation of the back gate electrode 6, the formation of the top gate electrode 7 and so on are performed as in the first embodiment.

In this manner, the semiconductor device according to the second embodiment may be manufactured.

Third Embodiment

Figure 7:
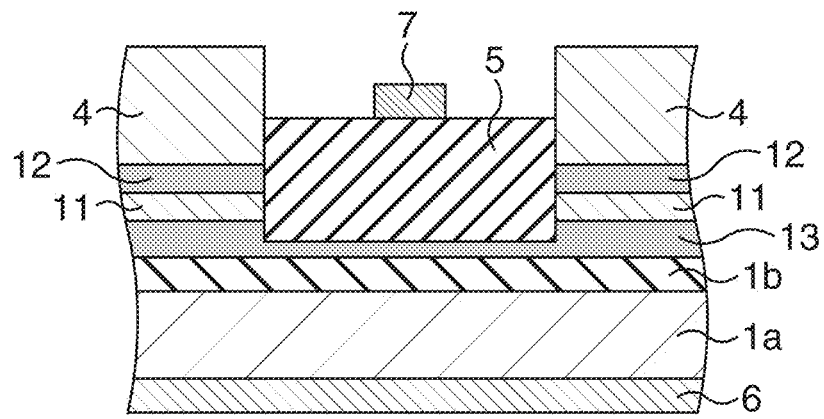
FIG. 7 is a sectional view illustrating a semiconductor device according to a third embodiment.

Next, a third embodiment will be described. FIG. 7 is a sectional view illustrating a semiconductor device according to the third embodiment.

In the third embodiment, as illustrated in FIG. 7, the graphene layer 12 is not suspended between two electrodes 4, and a lower portion of the graphene layer 13 extends between the two electrodes 4. Further, the insulation film 5 covers the upper surface and the side surfaces of the graphene layer 13. The other structure is the same as that of the second embodiment.

Also in the third embodiment, the graphene layers 12 and 13 may be formed at a lower temperature than that for the graphene layer 3 in the first embodiment. Accordingly, it is possible to suppress damage to an interlayer insulation film or the like that is susceptible to heat.

Figure 8A:
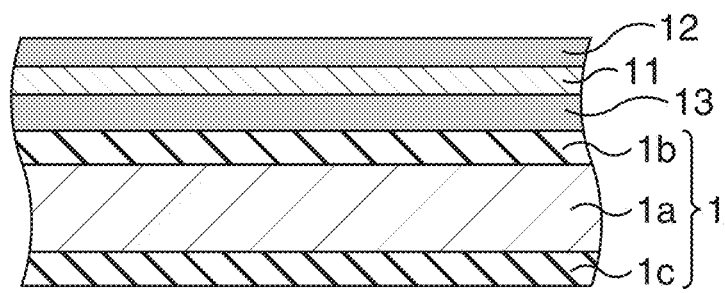
FIG. 8A is a sectional view illustrating a method of manufacturing the semiconductor device according to the third embodiment.
Figure 8B:
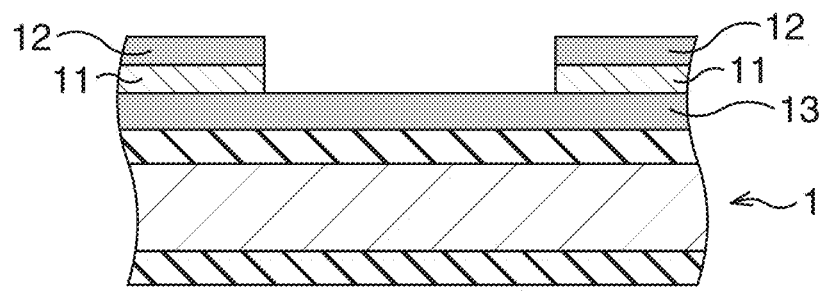
FIG. 8B is a sectional view illustrating, subsequently to FIG. 8A, the method of manufacturing the semiconductor device according to the third embodiment.
Figure 8C:
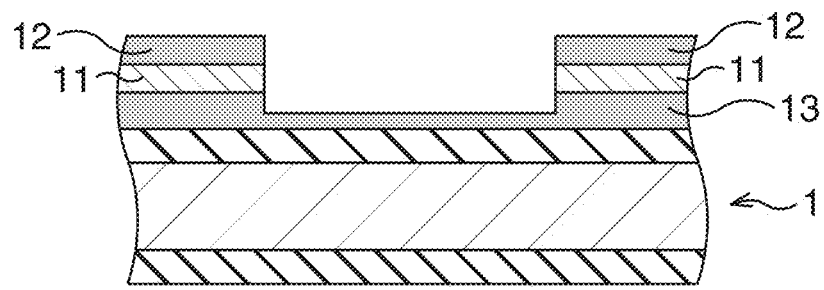
FIG. 8C is a sectional view illustrating, subsequently to FIG. 8B, the method of manufacturing the semiconductor device according to the third embodiment.

Next, a method of manufacturing the semiconductor device according to the third embodiment will be described. FIG. 8A to FIG. 8C are sectional views illustrating the method of manufacturing the semiconductor device according to the third embodiment in order of steps.

First, the metal film 11 is formed on the silicon oxide film 1b of the substrate 1 as in the second embodiment (see FIG. 6A). Subsequently, as illustrated in FIG. 8A, the graphene layers 12 and 13 are formed as in the second embodiment.

Thereafter, the graphene layer 12 and the metal film 11 are processed with a mask having an opening at a portion which will be a channel, whereby a part of the graphene layer 13 is exposed, as illustrated in FIG. 8B. As the processing of the graphene layer 12, for example, ashing (oxygen plasma processing) or heating in an oxygen atmosphere is performed. As the processing of the metal film 11, for example, acid treatment using hydrochloric acid, aqueous iron chloride solution, hydrofluoric acid or the like is performed.

Subsequently, the graphene layer 13 is thinned, as illustrated in FIG. 8C, with the mask used in the processing of the graphene layer 12 and the metal film 11. In the thinning of the graphene layer 13, for example, ashing is performed.

Then, the formation of the electrodes 4, the formation of the insulation film the formation of the back gate electrode 6, the formation of the top gate electrode 7 and so on are performed as in the second embodiment.

In this manner, the semiconductor device according to the third embodiment may be manufactured.

Fourth Embodiment

Figure 9:
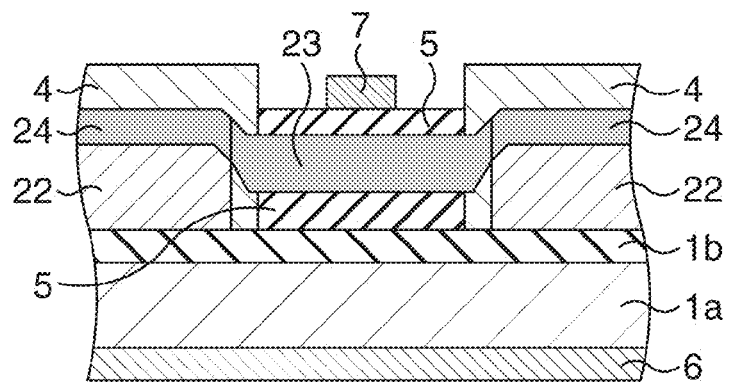
FIG. 9 is a sectional view illustrating a semiconductor device according to a fourth embodiment.

Next, a fourth embodiment will be described. FIG. 9 is a sectional view illustrating a semiconductor device according to the fourth embodiment.

In the fourth embodiment, as illustrated in FIG. 9, two catalyst films 22 are formed on the silicon oxide film 1b, and graphene layers 24 are formed on the catalyst films 22. The catalyst film 22 is, for example, a Fe film. The graphene layer 24 includes one layer, or two or more layers of graphene. Further, the electrodes 4 are formed to cover multilayer bodies of the graphene layers 24 and the catalyst films 22, and a graphene layer 23 is suspended between the two electrodes 4. Further, the insulation film 5 enclosing the graphene layer 23 is formed. The insulation film 5 is filled in a gap between the graphene layer 23 and the silicon oxide film 1b. Further, the insulation film 5 covers the upper surface of the graphene layer 23. Further, the top gate electrode 7 is formed on a portion of the insulation film 5 located on the upper surface of the graphene layer 23. Further, the back gate electrode 6 is formed on the back surface of the silicon layer 1a.

In the fourth embodiment configured as described above, since the graphene layer 24 can be used as a part of the wiring, the wiring resistance can be reduced. Further, manufacture in a shorter time than those in the first to the third embodiments is possible. Detailed description is followed.

Figure 10A:
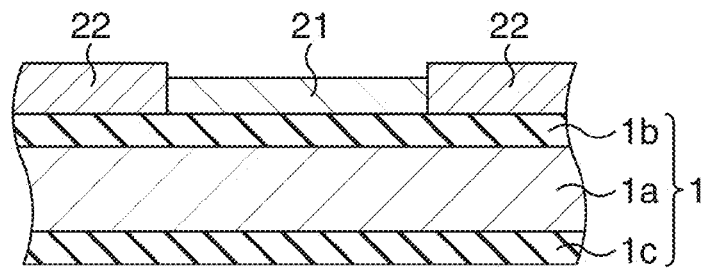
FIG. 10A is a sectional view illustrating a method of manufacturing the semiconductor device according to the fourth embodiment.
Figure 10B:
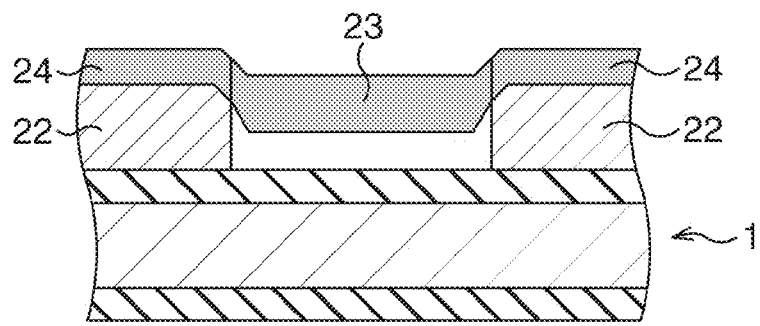
FIG. 10B is a sectional view illustrating, subsequently to FIG. 10A, the method of manufacturing the semiconductor device according to the fourth embodiment.
Figure 10C:
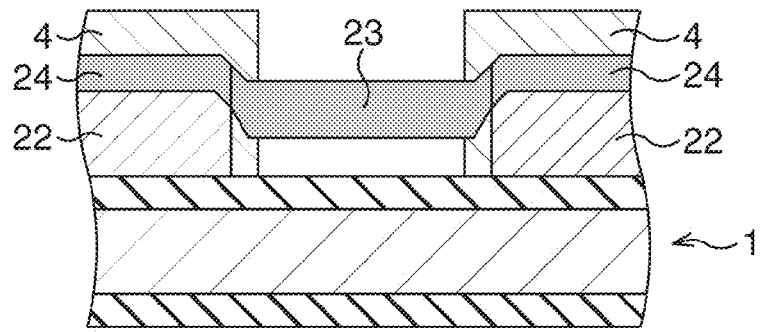
FIG. 10C is a sectional view illustrating, subsequently to FIG. 10B, the method of manufacturing the semiconductor device according to the fourth embodiment.

Next, a method of manufacturing the semiconductor device according to the fourth embodiment will be described. FIG. 10A to FIG. 10C are sectional views illustrating the method of manufacturing the semiconductor device according to the fourth embodiment in order of steps.

First, as illustrated in FIG. 10A, a catalyst film 21 and catalyst films 22 are formed on a substrate 1. The catalyst film 21 is formed at an area where a channel will be formed, and the catalyst films 22 are formed at areas where a source or a drain will be formed. Both of the catalyst films 21 and 22 may be formed by the lift-off method. Either one may be formed first. As the material of the catalyst films 21 and 22, the same material as that for the catalyst film 2 may be used. The thicknesses of the catalyst films 21 and 22 are set to, for example, about 50 nm or smaller, and the thickness of the catalyst film 21 is smaller than the thickness of the catalyst film 22. This is to aggregate the catalyst film 21 to the catalyst films 22. For example, the thickness of the catalyst film 21 is set to about 30 nm, and the thickness of the catalyst film 22 is set to about 50 nm.

Subsequently, as illustrated in FIG. 10B, the graphene layer 23 is formed on the catalyst film 21, and the graphene layers 24 are formed on the catalyst films 22. In the process of forming the graphene layers 23 and 24, the catalyst film 21 is aggregated to the catalyst films 22. Therefore, the catalyst film 21 disappears from under the graphene layer 23 and the catalyst films 22 become thicker. Note that when the formation of the graphene layers 23 and 24 is performed by the CVD method, the surfaces of the catalyst films 21 and 22 become gentle at the boundaries between them at the initial stage and the level difference caused by the difference in thickness disappears because the catalyst films 21 and 22 are made of the same material. Accordingly, the graphene layers 23 and 24 growing from the surfaces become physically and electrically continuous to each other.

Thereafter, as illustrated in FIG. 10C, the two electrodes 4 covering the upper surface and the side surfaces at end portions of the graphene layer 23 and covering multilayer bodies of the graphene layers 24 and catalyst films 22 are formed.

Subsequently, the formation of the insulation film 5, the formation of the back gate electrode 6, the formation of the top gate electrode 7 and so on are performed as in the first embodiment.

In this manner, the semiconductor device according to the fourth embodiment may be manufactured.

In the manufacturing method, since the catalyst film 21 is aggregated to the catalyst films 22, it is unnecessary to remove the catalyst film 21 by the acid treatment or the like. Accordingly, manufacture in a shorter time than those in the first to third embodiments is possible.

The graphene layer is used as a channel of a field-effect transistor in the first to fourth embodiments. The graphene layer may also be used as a wiring by adjusting the size of the graphene layer. Here, the control of the thickness of the graphene layer will be described.

Figure 11:
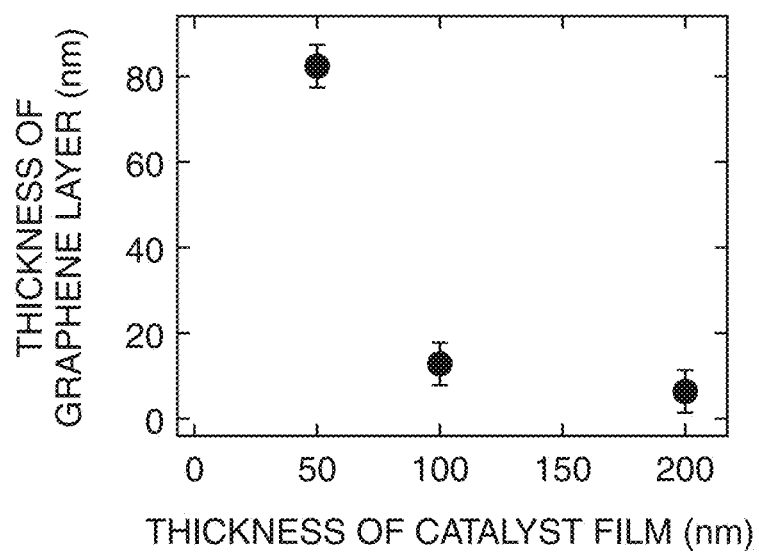
FIG. 11 is a graph indicating this relation between a thickness of a catalyst film and a thickness of a graphene layer.

The present inventors found the relation between the thickness of the catalyst film and the thickness of the graphene layer from an experiment. The result is presented in FIG. 11. In this experiment, a graphene layer was grown on an Fe film as a catalyst film by a hot filament CVD method. Further, a mixed gas (total pressure: 1 kPa) of acetylene and argon was used, the substrate temperature was set to 620° C., and the growth time was set to 60 minutes. Further, the flow rate of the mixed gas was set to 200 sccm, and only an argon gas was used as a dilution gas, and the acetylene concentration in the mixed gas was set to 10 vol %. Further, a substrate having a thermal oxide film with a thickness of 350 nm formed on the surface of a silicon layer was used. When the temperature of the hot filament was measured by a pyrometer, the temperature during the growth of the graphene layer was about 1000° C. For the growth, a vacuum chamber was used, the inside of the vacuum chamber was brought into a high vacuum at $1\times10^{-2}$ Pa or less by a turbo molecular pump or the like before introduction of the growth gas to remove moisture and the like in the vacuum chamber. It was shown that as the thickness of the catalyst film was increased, the thinner graphene layer was formed as depicted in FIG. 11. For example, when the thickness of the catalyst film was set to about 50 nm, a graphene layer with a thickness of about 80 nm was obtained, and when the thickness of the catalyst film was set to about 200 nm, a graphene layer with a thickness of about 6 nm was obtained.

Note that when the graphene layer is grown by the hot filament CVD method, it is preferable to perform cleaning the inside of the apparatus using hydrogen and/or ozone and improving the degree of vacuum by bake-out as necessary. The hot filament CVD method is a growth method in which current is passed through a metal wiring with a diameter of about several millimeters disposed above a substrate to heat the metal wiring to about 1000° C. to thereby decompose the raw material and heat the substrate. Further, the hot filament CVD method is suitable for a low temperature growth in which it is preferable to suppress influence of heat on the whole substrate. This is because the surface of the catalyst film is mainly heated.

Figure 12:
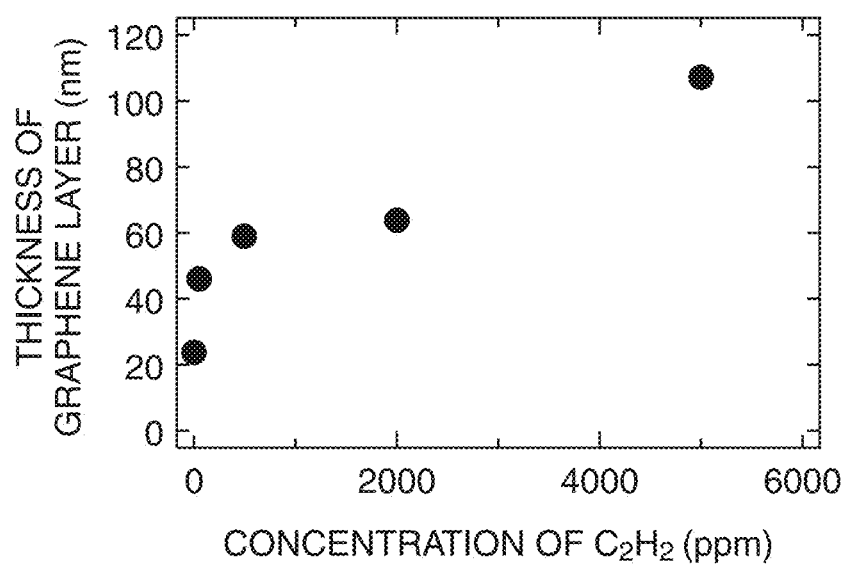
FIG. 12 is a graph indicating the relation between a concentration of acetylene and a thickness of a graphene layer.

The present inventors found the relation between the concentration of acetylene ($C_2H_2$) as the raw material gas and the thickness of the graphene layer from an experiment. The result is depicted in FIG. 12. In this experiment, the graphene layer was grown on an Fe film as the catalyst film by the thermal CVD method. Further, a mixed gas (total pressure: 1 kPa) of acetylene and argon was used, the substrate temperature was set to 650° C., the thickness of the catalyst film (Fe film) was set to 200 nm, and the growth time was set to 20 minutes. The concentration of acetylene was adjusted with dilution using argon. Further, the flow rate of the mixed gas was set to 1000 sccm, and only an argon gas was used as the dilution gas. Further, a substrate having a thermal oxide film with a thickness of 350 nm formed on the surface of a silicon layer was used. For the growth, a vacuum chamber was used, the inside of the vacuum chamber was brought into a high vacuum at $1\times10^{-2}$ Pa or less by a turbo molecular pump or the like before introduction of the growth gas to remove moisture and the like in the vacuum chamber. It was shown that as the acetylene concentration was increased, the thicker graphene layer was formed as depicted in FIG. 12. For example, when the acetylene concentration was set to about 5000 ppm, a graphene layer with a thickness of about 110 nm was obtained, and when the acetylene concentration was set to about 500 ppm, a graphene layer with a thickness of about 59 nm was obtained.

Note that also when the graphene layer is grown by the thermal CVD method, it is preferable to perform cleaning the inside of the apparatus using hydrogen and/or ozone and improving the degree of vacuum by bake-out as necessary. Further, it is also possible to use a load lock to improve the degree of vacuum by a method of not opening the inside of the growth furnace directly to the atmosphere. The thermal CVD method is suitable for the processing of a large-area wafer. This is because the thermal CVD method has no heat source and no plasma source above the substrate unlike the hot filament CVD method, and therefore achieves better temperature uniformity than that by the hot filament CVD method.

Figure 13:
FIG. 13 is a view presenting a transmission electron microscope photograph of a graphene layer formed when an acetylene concentration was set to about 500 ppm.
Figure 14:
FIG. 14 is a view presenting a transmission electron microscope photograph of a graphene layer formed when an acetylene concentration was set to about 5000 ppm.
Figure 15:
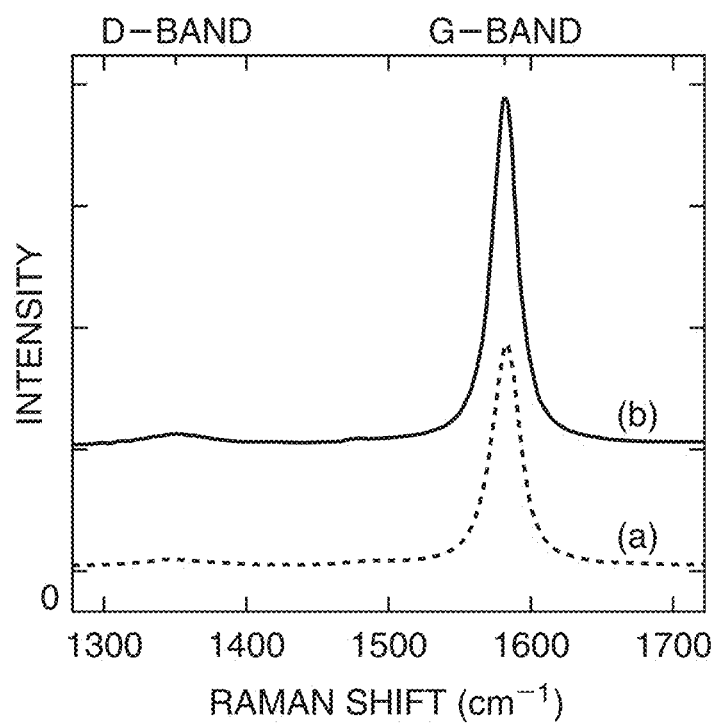
FIG. 15 is a graph depicting spectrum of a G-band and a D-band measured by a Raman scattering spectroscopy of the graphene layers presented in FIG. 13 and FIG. 14.

A TEM photograph of the graphene layer formed when the acetylene concentration was set to about 500 ppm is presented in FIG. 13, and a TEM photograph of the graphene layer formed when the acetylene concentration was set to about 5000 ppm is presented in FIG. 14. Further, spectrum of a G-band and a D-band measured by the Raman scattering spectroscopy of the graphene layers presented in FIG. 13 and FIG. 14 are depicted in FIG. 15. A broken line (a) in FIG. 15 represents the spectrum of the G-band and the D-band of the graphene layer in FIG. 13, and a solid line (b) represents the spectrum of the G-band and the D-band of the graphene layer in FIG. 14. The ratio between the G-band and the D-band (G/D ratio) reflects the quality and the domain size of the graphene layer, and a higher G/D ratio indicates better quality of the graphene layer. As depicted in FIG. 15, the G/D ratio of the graphene layer in FIG. 13 is 34.1 and the G/D ratio of the graphene layer in FIG. 14 is 37.6, both of which indicate good ratios. Further, the G/D ratios of other graphene layers grown from the catalyst film were as high as about 20 to 40. This indicates that it is possible to grow a high-quality graphene layer even at a relatively low temperature.

Figure 16:
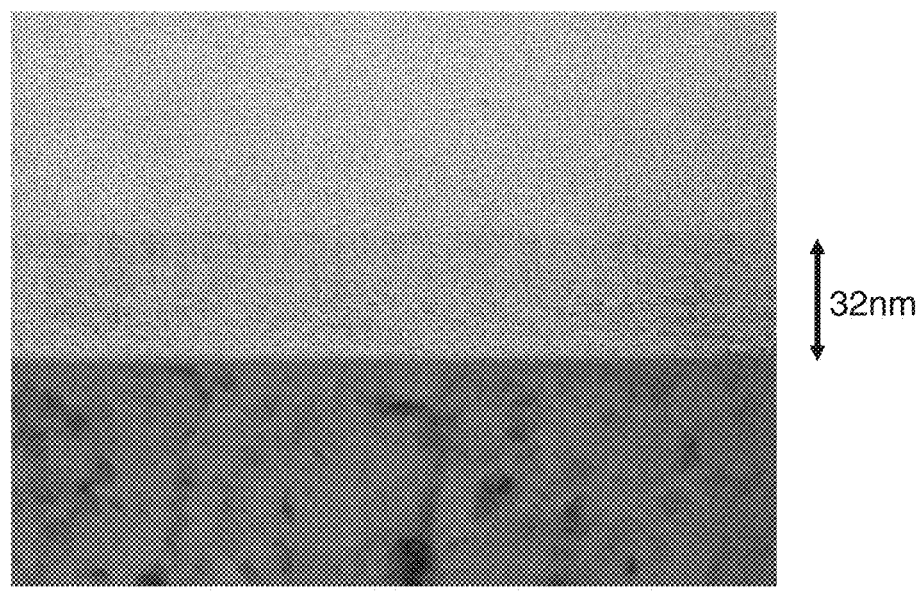
FIG. 16 is a view presenting a transmission electron microscope photograph of a graphene layer formed when a growth time was made shorter than that of the graphene layer in FIG. 13.

A TEM photograph of the graphene layer formed when the growth time was made shorter than that of the graphene layer in FIG. 13 is presented in FIG. 16. The graphene layer presented in FIG. 16 was grown under the same conditions as those of the graphene layer presented in FIG. 13 except that the growth time was set to 5 minutes. The thickness of the graphene layer presented in FIG. 16 is about 32 nm. Though the growth time of the graphene layer presented in FIG. 16 is ¼ of that of the graphene layer presented in FIG. 13, the thickness of the graphene layer presented in FIG. 16 is ½ or thicker than that of the graphene layer presented in FIG. 13. From this, the thickness of the graphene layer is considered to be larger according to the growth time, and it is not proportional to the growth time. Actually, it is supposed that the growth of the graphene layer was saturated between the growth time of 5 minutes and 20 minutes.

Figure 17:
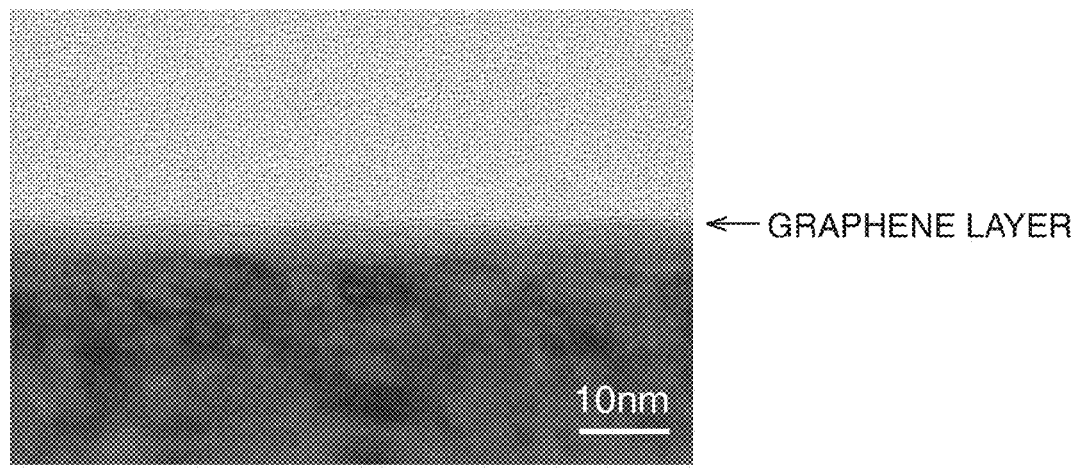
FIG. 17 is a view presenting a transmission electron microscope photograph of a graphene layer of about two layers of graphene.

Note that when the graphene layer is used as a channel of a field-effect transistor, a smaller number of layers of graphene included in the graphene layer is preferable, and the number of layers preferably ranges from 1 to 10. When the present inventors grew a graphene layer with the thickness of a catalyst film (Fe film) set to 500 nm, a growth time set to 1 minute, and a concentration of acetylene set to 2 ppm, a graphene layer of about two layers of graphene was obtained as presented in FIG. 17. Note that the other conditions were set to the same as the growth conditions of the graphene layers presented in FIG. 13, FIG. 14 (substrate temperature: 650° C., total pressure: 1 kPa and so on). Such a graphene layer is suitable for the channel. Note that the graphene layer may be formed to be slightly thicker and then thinned by ashing or the like to be used as a channel.

Figure 18:
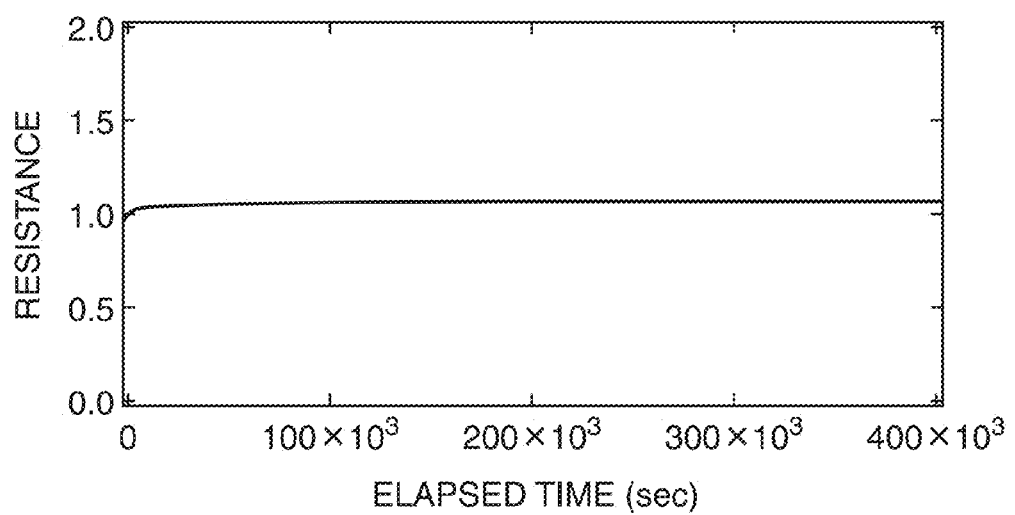
FIG. 18 is a graph depicting a current density resistance of a graphene layer.

On the other hand, when the graphene layer is used as a wiring of the semiconductor device, it is enough that the thickness of the graphene layer is about several nanometers. When the present inventors measured the current density resistance of the graphene layer with a thickness of about 7 nm, the result depicted in FIG. 18 was obtained. In this experiment, current was passed through the graphene layer at a high density of $1\times10^7$ A/cm$^2$, and the change in resistance was observed. As a result, the resistance rarely increased even though, the current was passed for 100 hours or longer as illustrated in FIG. 18. This indicates that the graphene layer with a thickness of about 7 nm can sufficiently as a wiring.

Fifth Embodiment

Figure 19:
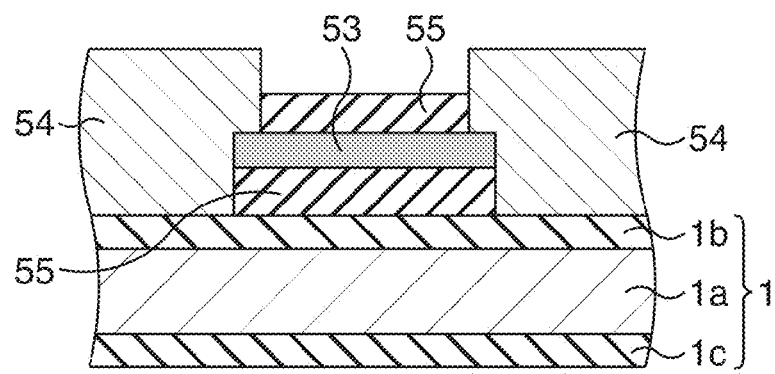
FIG. 19 is a sectional view illustrating a semiconductor device according to a fifth embodiment.

Next, a fifth embodiment will be described. FIG. 19 is a sectional view illustrating a semiconductor device according to the fifth embodiment.

In the fifth embodiment, as illustrated in FIG. 19, two conductive layers 54 are formed on the substrata 1 including the silicon layer 1a, the silicon oxide film 1b, and the silicon oxide film 1c. Further, a graphene layer 53 is suspended between the two conductive layers 54. The graphene layer 53 includes a plurality of graphenes. Further, an insulation film 55 enclosing the graphene layer 53 is formed. The insulation film 55 is filled in a gap between the graphene layer 53 and the silicon oxide film 1b. Further, the insulation film 55 covers the upper surface of the graphene layer 53. Examples of the material of the insulation film 55 include hafnium oxide, aluminum oxide, silicon oxide, HfAlO, AlN, BN, $TiO_2$, $Ta_2O_3$, $V_2O_3$, $Nb_2O_3$, and so on.

In the fifth embodiment configured as described above, the graphene layer 53 serves as a wiring and the conductive layer 54 serves as a connection part between another wiring and the graphene layer 53. In the wiring made of graphene, migration occurring in a metal wiring never occurs. Therefore, a high reliability is easily ensured.

Next, a method of manufacturing the semiconductor device according to the fifth embodiment will be described. FIG. 20A to FIG. 20E are sectional views illustrating the method of manufacturing the semiconductor device according to the fifth embodiment in order of steps.

Figure 20A:
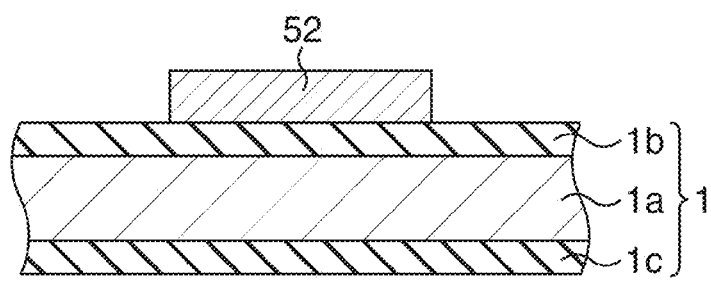
FIG. 20A is a sectional view illustrating a method of manufacturing the semiconductor device according to the fifth embodiment.

First, as illustrated in FIG. 20A, a catalyst film 52 is formed on the substrate 1. As the catalyst film 52, for example, the one made of the same material as that of the catalyst film 2 is used.

Figure 20B:
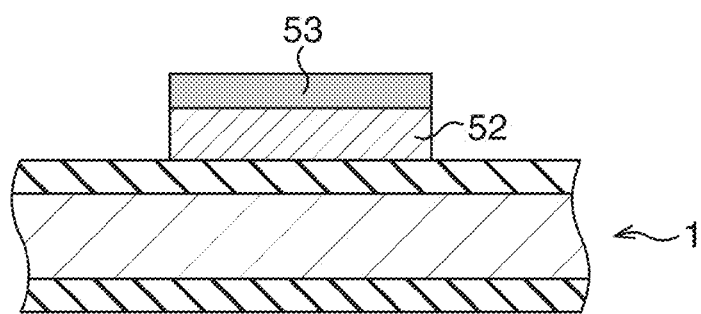
FIG. 20B is a sectional view illustrating, subsequently to FIG. 20A, the method of manufacturing the semiconductor device according to the fifth embodiment.

Then, illustrated in FIG. 20B, the graphene layer 53 is formed on the catalyst film 52. The formation of the graphene layer 53 performed, for example, in a vacuum chamber by the thermal CVD method, the hot filament CVD method, the remote plasma CVD method, the plasma CVD method or the like.

Figure 20C:
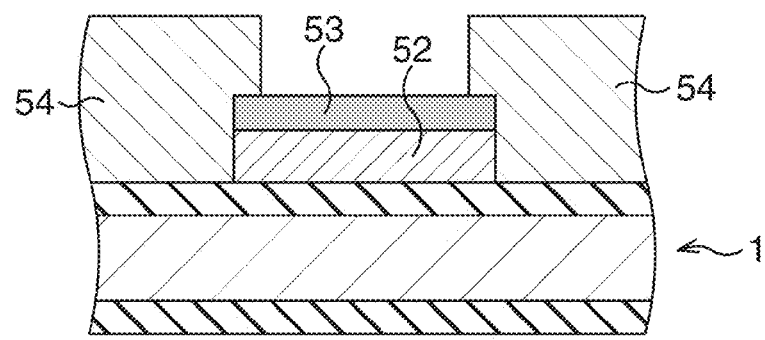
FIG. 20C is a sectional view illustrating, subsequently to FIG. 20B, the method of manufacturing the semiconductor device according to the fifth embodiment.

Thereafter, as illustrated in FIG. 20C, the two conductive layers 54 covering the upper surface and the side surfaces at end portions of the graphene layer 53 are formed on the silicon oxide film 1b. As the conductive layers 54, for example, the ones similar to the electrodes 4 are formed.

Figure 20D:
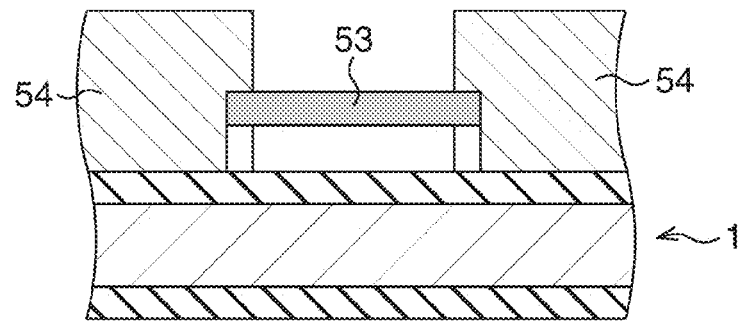
FIG. 20D is a sectional view illustrating, subsequently to FIG. 20C, the method of manufacturing the semiconductor device according to the fifth embodiment.

Subsequently, as illustrated in FIG. 20D, the catalyst film 52 is removed. Since both end portions of the graphene layer 53 are held by the conductive layers 54 from the sides, the graphene layer 53 is suspended between the conductive layers 54. Note that the catalyst film 52 may be removed by the wet treatment using, for example, hydrochloric acid, aqueous iron chloride solution, hydrofluoric acid or the like.

Figure 20E:
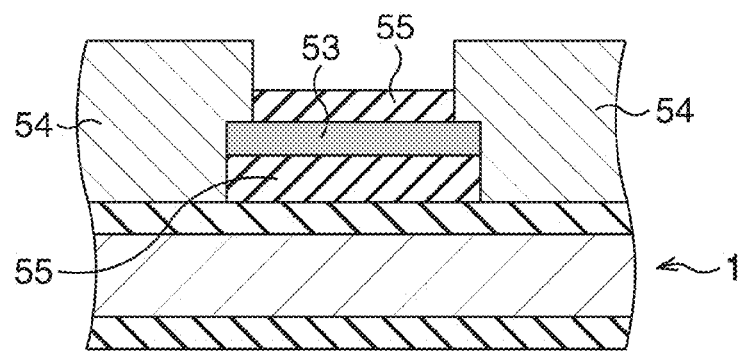
FIG. 20E is a sectional view illustrating, subsequently to FIG. 20D, the method of manufacturing the semiconductor device according to the fifth embodiment.

Subsequently, as illustrated in FIG. 20E, the insulation film 55 covering exposed surfaces of the graphene layer 53 is formed. When hafnium oxide or aluminum oxide is used as the material of the insulation film 55, the insulation film 55 may be deposited to cover the graphene layer 53, for example, by the ALD method. When hafnium oxide is used as the material of the insulation film 55, the insulation film 55 may be formed at a temperature of 250° C. using, for example, TDMAH as a raw material. When aluminum oxide is used as the material of the insulation film 55, the insulation film 55 may be formed at a temperature of 300° C. using trimethylaluminum as a raw material. When silicon oxide is used as the material of the insulation film 55, the insulation film 55 may be formed by applying, for example, an SOG solution by the spin coating method and annealing it at a temperature of about 500° C. in a nitrogen atmosphere.

In this manner, the semiconductor device according to the fifth embodiment may be manufactured.

Sixth Embodiment

Figure 21:
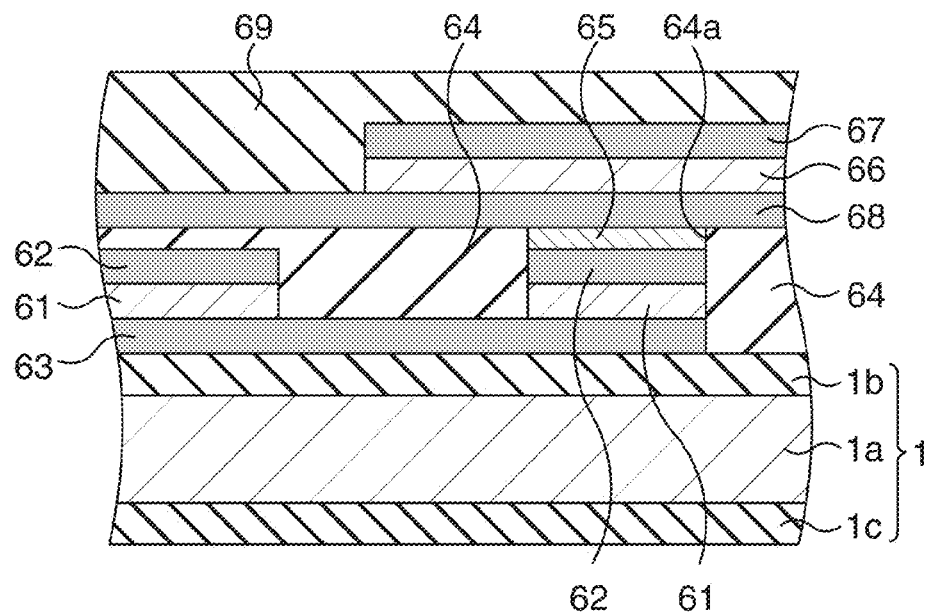
FIG. 21 is a sectional view illustrating a semiconductor device according to a sixth embodiment.

Next, a sixth embodiment will be described. FIG. 21 is a sectional view illustrating a semiconductor device according to the sixth embodiment.

In the sixth embodiment, a graphene layer 63 is formed as a part of a wiring on the silicon oxide film 1b of the substrate 1, and a metal film 61 and a graphene layer 62 are layered in this order on parts of the graphene layer 63. Further, an interlayer insulation film 64 covering the graphene layer 62, the metal film 61, and the graphene layer 63 is formed on the silicon oxide film 1b. As the metal film 61, for example, the similar one to the metal film 11 is used, and the graphene layers 62 and 63 include a plurality of graphenes. As the interlayer insulation film 64, for example, a silicon oxide film in which TEOS (tetraethylorthosilicate) is used a raw material, a low-dielectric constant film or the like is used. In the interlayer insulation film 64, an opening 64a exposing a part of the graphene layer 62 is formed, and a conductive material is filled in the opening 64a. As the conductive material 65, a conductive film, a bundle of carbon nanotubes, a graphene layer including a plurality of graphenes or the like is formed. Examples of the material of the conductive film include, for example, copper, titanium, titanium silicide, titanium nitride, titanium carbide, tantalum, tantalum nitride, aluminum, tungsten, vanadium, niobium, molybdenum, cobalt, nickel, iron, gold, platinum and the like.

On the interlayer insulation film 64, a graphene layer 68 in contact with the conductive material 65 is formed as a part of wiring, and a metal film 66 and a graphene layer 67 are formed in this order on a part of the graphene layer 68. Further, an interlayer insulation film 69 covering the graphene layer 67, the metal film 66, and the graphene layer 68 is formed above the interlayer insulation film 64. As the metal film 66, for example, the similar one to the metal film 11 is used. The graphene layers 67 and 68 include a plurality of graphenes. As the interlayer insulation film 69, for example, a silicon oxide film in which TEOS is used as a raw material, a low-dielectric constant film or the like is used.

In the sixth embodiment, a multilayer wiring is formed in this manner. In the sixth embodiment, graphene layers are used for the multilayer wiring. Therefore, a high reliability can be ensured while the migration is suppressed.

Note that a multilayer wiring structure, a transistor structure or the like may be provided at a part corresponding to the substrate 1.

Next, a method of manufacturing the semiconductor device according to the sixth embodiment will be described. FIG. 22A to FIG. 22J are sectional views illustrating the method of manufacturing the semiconductor device according to the sixth embodiment in order of steps.

Figure 22A:
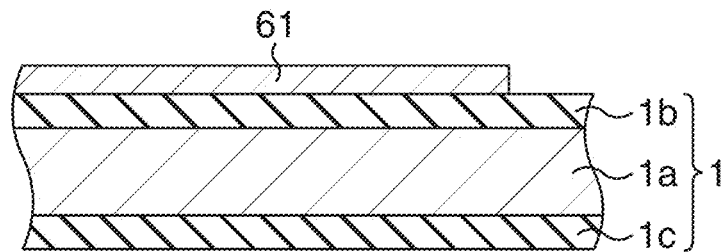
FIG. 22A is a sectional view illustrating a method of manufacturing the semiconductor device according to the sixth embodiment.

First, as illustrated in FIG. 22A, the metal film 61 in a predetermined planar shape is formed on the silicon oxide film 1b of the substrate 1.

Figure 22B:
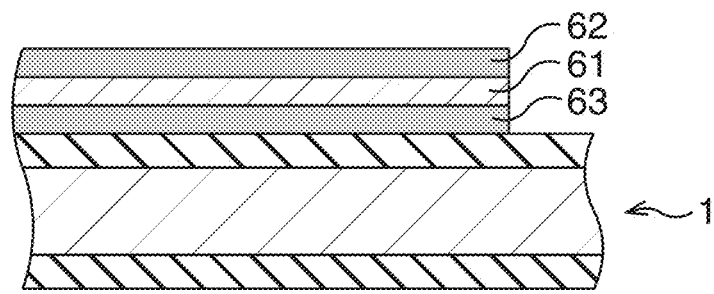
FIG. 22B is a sectional view illustrating, subsequently to FIG. 22A, the method of manufacturing the semiconductor device according to the sixth embodiment.

Then, as illustrated in FIG. 22B, the graphene layer 62 is formed on the metal film 61 and the graphene layer 63 is formed between the metal film 61 and the silicon oxide film 1b by the thermal CVD method, for example. In this event, the metal film 61 serves as a catalyst film.

Figure 22C:
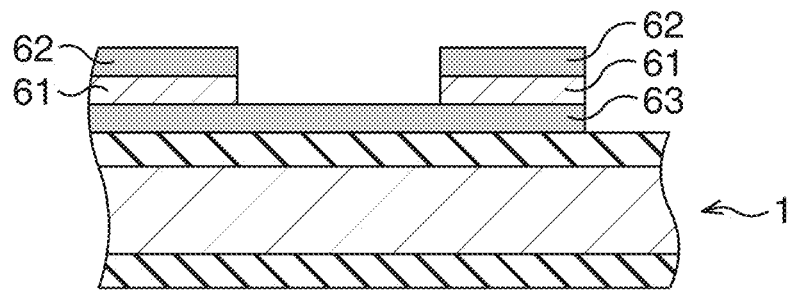
FIG. 22C is a sectional view illustrating, subsequently to FIG. 22B, the method of manufacturing the semiconductor device according to the sixth embodiment.

Thereafter, the graphene layer 62 and the metal film 61 are processed with a mask, whereby a part of the graphene layer 63 is exposed, as illustrated in FIG. 22C. As the processing of the graphene layer 62, for example, ashing (oxygen plasma processing) or heating in an oxygen atmosphere is performed. As the processing of the metal film 61, for example, acid treatment using hydrochloric acid, aqueous iron chloride solution, hydrofluoric acid or the like is performed.

Figure 22D:
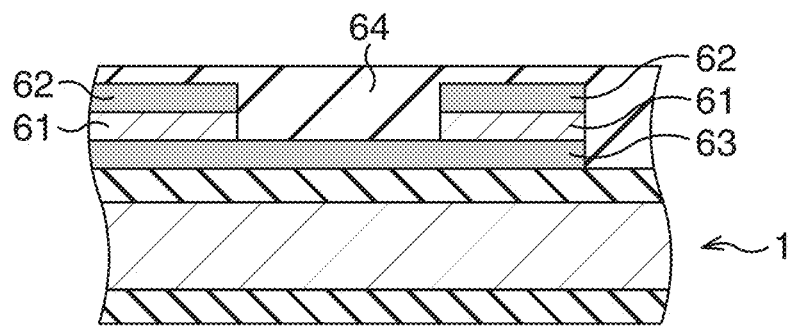
FIG. 22D is a sectional view illustrating, subsequently to FIG. 22C, the method of manufacturing the semiconductor device according to the sixth embodiment.

Subsequently, as illustrated in FIG. 22D, the interlayer insulation film 64 covering the graphene layer 62, the metal film 61, and the graphene layer 63 is formed on the silicon oxide film 1b by the CVD method, the spin coating method or the like.

Figure 22E:
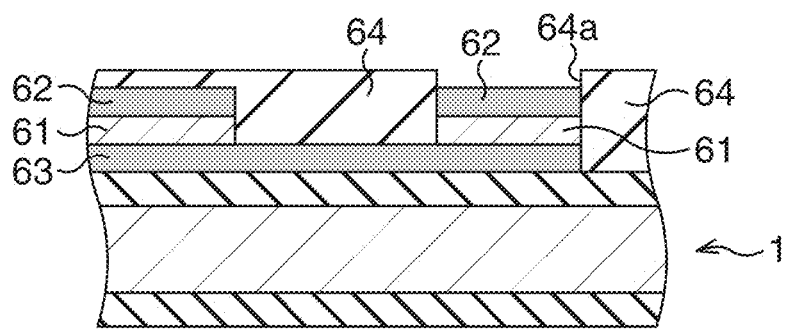
FIG. 22E is a sectional view illustrating, subsequently to FIG. 22D, the method of manufacturing the semiconductor device according to the sixth embodiment.

Then, as illustrated in FIG. 22E, the opening 64a exposing a part of the graphene layer 62 is formed in the interlayer insulation film 64.

Figure 22F:
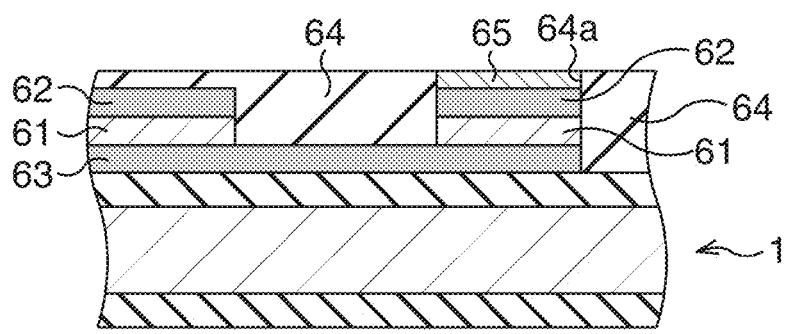
FIG. 22F is a sectional view illustrating, subsequently to FIG. 22E, the method of manufacturing the semiconductor device according to the sixth embodiment.

Thereafter, as illustrated in FIG. 22F, the conductive material 65 is formed in the opening 64a.

Figure 22G:
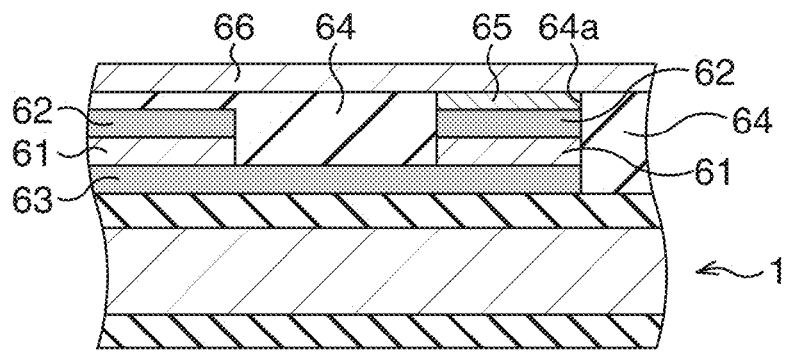
FIG. 22G is a sectional view illustrating, subsequently to FIG. 22F, the method of manufacturing the semiconductor device according to the sixth embodiment.

Subsequently, as illustrated in FIG. 22G, the metal film 66 in a predetermined planar shape is formed on the interlayer insulation film 64.

Figure 22H:
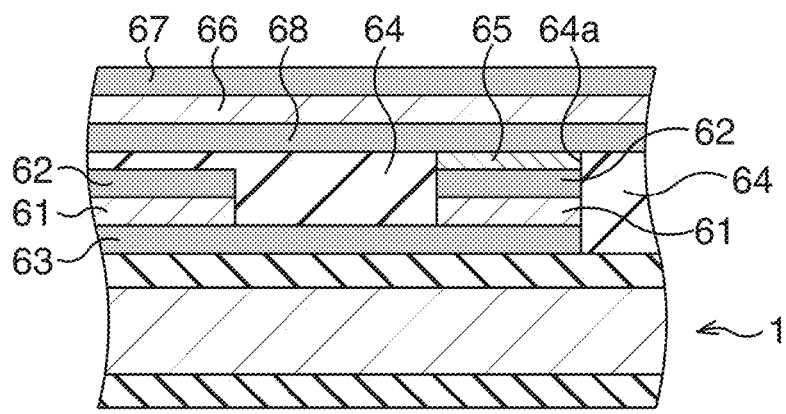
FIG. 22H is a sectional view illustrating, subsequently to FIG. 22G, the method of manufacturing the semiconductor device according to the sixth embodiment.

Then, as illustrated in FIG. 22H, the graphene layer 67 is formed on the metal film 66 and the graphene layer 68 is formed between the metal film 66, and, the interlayer insulation film 64 and the conductive material 65 by the thermal CVD method, for example. In this event, the metal film 66 serves as a catalyst film.

Figure 22I:
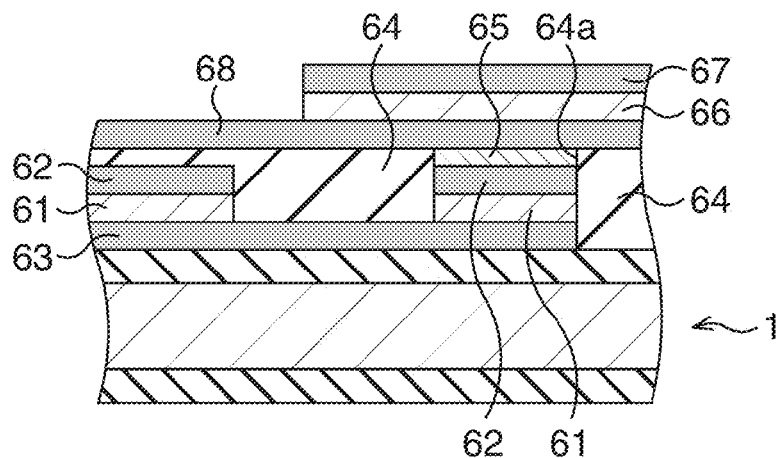
FIG. 22I is a sectional view illustrating, subsequently to FIG. 22H, the method of manufacturing the semiconductor device according to the sixth embodiment.
Figure 22J:
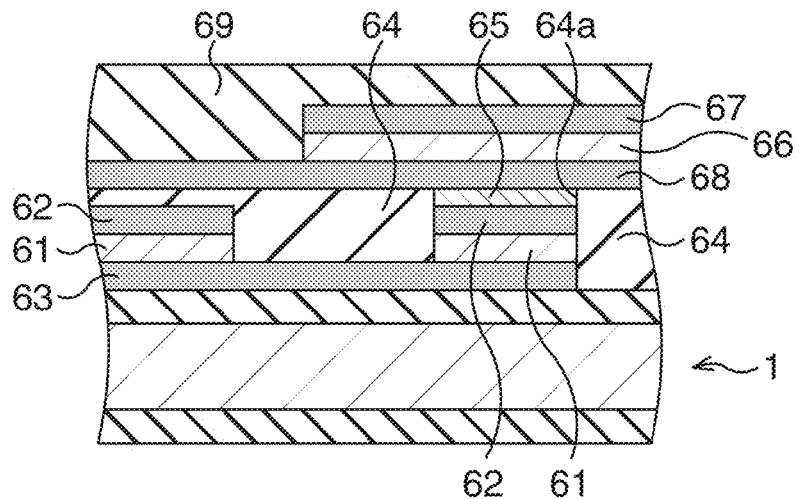
FIG. 22J is a sectional view illustrating, subsequently to FIG. 22I, the method of manufacturing the semiconductor device according to the sixth embodiment.

Thereafter, the processing of the graphene layer 67 and the metal film 66 with a mask, whereby a part of the graphene layer 68 is exposed as illustrated in FIG. 22I. As the processing of the graphene layer 67, for example, ashing (oxygen plasma processing) or heating in an oxygen atmosphere is performed. As the processing of the metal film 66, for example, acid treatment using hydrochloric acid, aqueous iron chloride solution, hydrofluoric acid or the like is performed.

Subsequently, the interlayer insulation film 69 covering the graphene layer 67, the metal film 66, and the graphene layer 68 is formed above the interlayer insulation film 64 by the CVD method, the spin coating method or the like.

Figure 23:
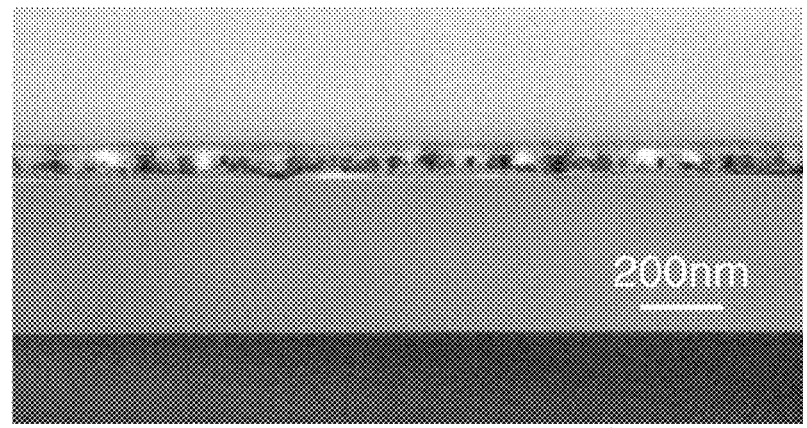
FIG. 23 is a view presenting a transmission electron microscope photograph of a multilayer structure of a graphene layer, a metal film, and a graphene layer.

Thereafter, the similar processing is repeated, whereby a multilayer wiring may be formed. A TEM photograph of a multilayer structure of the graphene layer 62, the metal film 61, and the graphene layer 63 is presented in FIG. 23. A multilayer body of the graphene layer 67, the metal film 66, and the graphene layer 68 has a similar structure.

Note that though parts of the metal film 61, the graphene layer 62, the metal film 66, and the graphene layer 67 are removed in this embodiment, it is not always necessary to perform these processing. Further, processing of the graphene layer 63 and/or the graphene layer 68 may be performed. Further, the interlayer insulation films 64 and 69 may be removed by the treatment using hydrofluoric acid or the like to form an air-gap wiring.

Seventh Embodiment

Next, a seventh embodiment will be described. In the seventh embodiment, a field-effect transistor and a wiring are formed in parallel. FIG. 24A to FIG. 24E are sectional views illustrating the method of manufacturing the semiconductor device according to the seventh embodiment in order of steps.

Figure 24A:
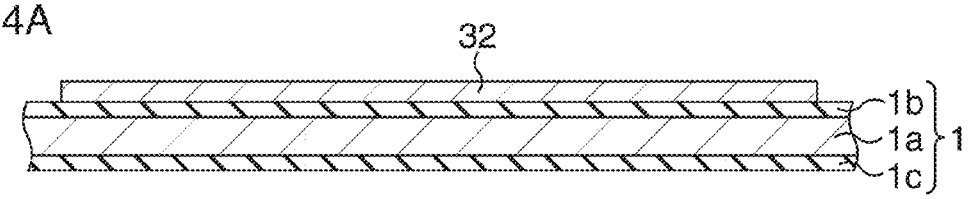
FIG. 24A is a sectional view illustrating a method of manufacturing a semiconductor device according to a seventh embodiment.

First, as illustrated in FIG. 24A, a catalyst film 32 is formed on the silicon oxide film 1b of the substrate 1 at an area where the field-effect transistor and the wiring will be formed. As the catalyst film 32, the similar to the catalyst film 2 is formed.

Figure 24B:
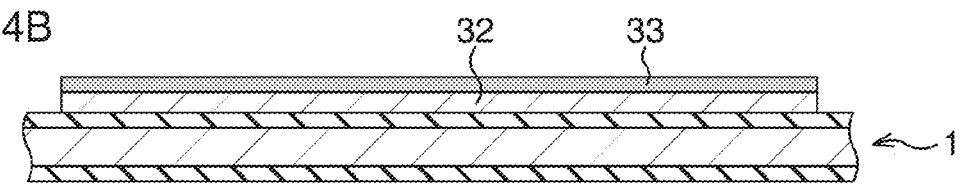
FIG. 24B is a sectional view illustrating, subsequently to FIG. 24A, the method of manufacturing the semiconductor device according to the seventh embodiment.

Subsequently, as illustrated in FIG. 24B, a graphene layer 33 is formed on a catalyst film 32. The formation of the graphene layer 33 is performed as with the formation of the grapheme layer 3.

Figure 24C:
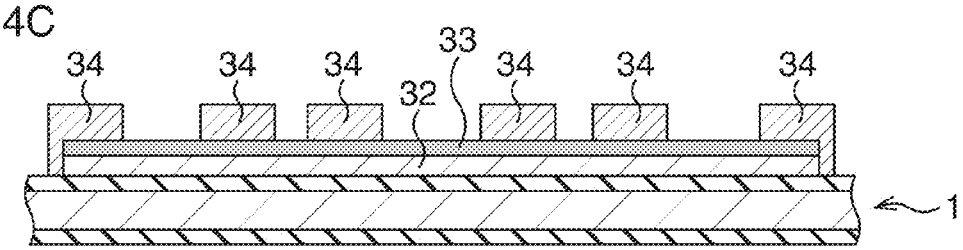
FIG. 24C is a sectional view illustrating, subsequently to FIG. 24B, the method of manufacturing the semiconductor device according to the seventh embodiment.

Thereafter, as illustrated in FIG. 24C, conductive films 34 are formed at portions which will be a source electrode or a drain electrode of the field-effect transistor or a connection part of the wiring. As the conductive film 34, the similar one to the electrode 4 is formed.

Figure 24D:
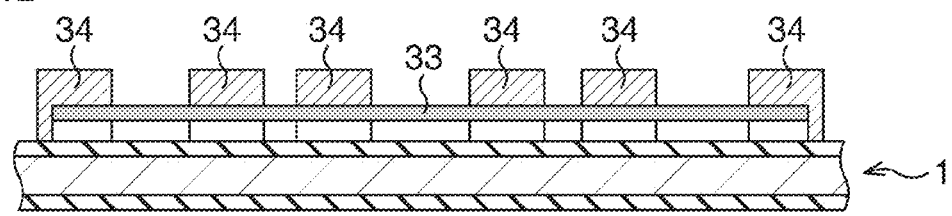
FIG. 24D is a sectional view illustrating, subsequently to FIG. 24C, the method of manufacturing the semiconductor device according to the seventh embodiment.
Figure 24E:
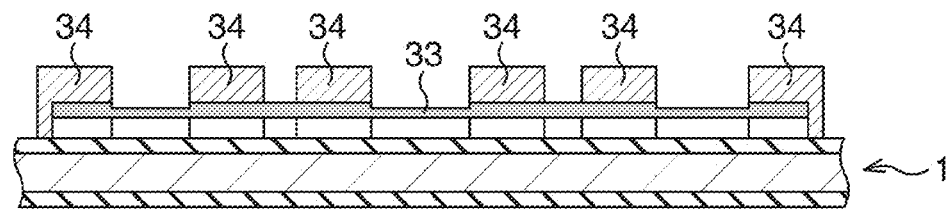
FIG. 24E is a sectional view illustrating, subsequently to FIG. 24D, the method of manufacturing the semiconductor device according to the seventh embodiment.

Subsequently, as illustrated in FIG. 24D, the catalyst film 32 is removed. The removal of the catalyst film 32 is performed as with the removal of the catalyst film 2.

Then, a portion of the graphene layer 33 which is used as the channel of the field-effect transistor is thinned. The thinning is performed, for example, by ashing (oxygen plasma processing) or thermal oxidation.

Thereafter, the formation of an insulation film covering the graphene layer 33, the formation of a back gate electrode, the formation of a top gate electrode, the formation of an interlayer insulation film, the formation of an upper wiring and so on are performed to complete a semiconductor device.

According to the seventh embodiment, the field-effect transistor and the wiring are connected to each other without seam. Therefore, there exists no or little contact resistance between them, resulting in excellent characteristics. Further, it is also possible to make the characteristics of a plurality of field-effect transistors more uniform.

Note that when the graphene layer is used as the wiring, the graphene layer does not always need to be covered with the insulation film.

Furthermore, in these embodiments, a zirconium oxide film, a titanium oxide film, a tantalum oxide film of the like may be used as the insulation film in place of the silicon oxide film, the hafnium oxide film, or the aluminum oxide film.

Further, the graphene layer does not always need to be covered with the insulation film, and its surroundings do not need to be in a vacuum state. Further, gas or liquid may be enclosed in the surroundings.

Further, the uses of these semiconductor devices are not particularly limited, and may be used, for example, as a high-power amplifier for a radio base station, a high-power amplifier for a cellular phone base station, a semiconductor element for a server, a semiconductor element for a personal computer, an on-vehicle integrated circuit (IC), and a motor-driving transistor of an electric vehicle.

INDUSTRIAL APPLICABILITY

The present invention is suitable for an industry relating to a semiconductor device including a graphene layer and a method of manufacturing the same.

The invention claimed is:
1. A semiconductor device, comprising:
a source electrode and a drain electrode;
a channel including a graphene layer suspended by the source electrode and the drain electrode;
a gate electrode which changes a band structure of the graphene layer; and
a gate insulation film formed between the gate electrode and the channel, wherein
the graphene layer extends in a direction apart from the channel over the source electrode and the drain electrode, and the channel is thinner than a portion of the graphene layer extending in the direction apart from the channel over the source electrode and the drain electrode.

2. The semiconductor device according to claim 1, wherein
the source electrode and the drain electrode are formed over an insulator, and
the channel is formed apart from the insulator.

3. The semiconductor device according to claim 1, further comprising:
a first wiring including the portion of the graphene layer extending in the direction apart from the channel over the source electrode; and
a second wiring including the portion of the graphene layer extending in the direction apart from the channel over the drain electrode.

4. The semiconductor device according to claim 3, further comprising:
a first electrode connected to the first wiring, and
a second electrode connected to the second wiring.

* * * * *